United States Patent
Li et al.

(10) Patent No.: US 9,905,999 B2
(45) Date of Patent: Feb. 27, 2018

(54) OPTICAL FREQUENCY DIVIDER BASED ON AN ELECTRO-OPTICAL-MODULATOR FREQUENCY COMB

(71) Applicant: CALIFORNIA INSTITUTE OF TECHNOLOGY, Pasadena, CA (US)

(72) Inventors: Jiang Li, Pasadena, CA (US); Kerry Vahala, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 15/053,876

(22) Filed: Feb. 25, 2016

(65) Prior Publication Data

US 2016/0254646 A1  Sep. 1, 2016

Related U.S. Application Data

(60) Provisional application No. 62/121,257, filed on Feb. 26, 2015.

(51) Int. Cl.
*H01S 5/068* (2006.01)
*H01S 5/0687* (2006.01)
(Continued)

(52) U.S. Cl.
CPC .......... *H01S 5/0687* (2013.01); *H01S 3/0085* (2013.01); *H01S 3/0627* (2013.01);
(Continued)

(58) Field of Classification Search
CPC ....................................................... H01S 5/068
See application file for complete search history.

(56) References Cited

U.S. PATENT DOCUMENTS 5,872,022 A    5/1980    Shepard
4,461,672 A    7/1984    Musser
(Continued)

FOREIGN PATENT DOCUMENTS

JP      2010-050758 A    3/2010
KR      100796258 B1    1/2008
(Continued)

OTHER PUBLICATIONS

Adar, R., et al., Less than 1 dB Per Meter Propagation Loss of Silica Waveguides Measured Using a Ring Resonator, J. Lightwave Tech. 1994, 12: 1369-1372.

(Continued)

*Primary Examiner* — Hai L Nguyen
(74) *Attorney, Agent, or Firm* — Steinfl + Bruno LLP; David S. Alavi

(57) ABSTRACT

Microwave-frequency signal generation by generating multiple sideband optical signals separated by phase-modulation frequency $f_M$, generating beat signals between one or two sidebands and one or two optical reference signals, generating a loop-filtered error signal by comparing an electrical reference signal to one of the beat signals or their difference, and controlling with the error signal in a phase-locked loop arrangement a voltage-controlled oscillator (VCO) that drives the sideband generation at the frequency $f_M$. A portion of the VCO output is the generated microwave-frequency signal.

53 Claims, 4 Drawing Sheets

(51) Int. Cl.
*H01S 5/00* (2006.01)
*H01S 5/04* (2006.01)
*H01S 5/062* (2006.01)
*H01S 5/40* (2006.01)
*H01S 3/06* (2006.01)
*H01S 3/13* (2006.01)
*H01S 3/30* (2006.01)
*H01S 3/00* (2006.01)
*H03L 7/00* (2006.01)
*H03B 17/00* (2006.01)
*H01S 3/067* (2006.01)
*H01S 3/23* (2006.01)

(52) U.S. Cl.
CPC .............. *H01S 3/1304* (2013.01); *H01S 3/30* (2013.01); *H01S 5/0078* (2013.01); *H01S 5/041* (2013.01); *H01S 5/0623* (2013.01); *H01S 5/06817* (2013.01); *H01S 5/40* (2013.01); *H03B 17/00* (2013.01); *H03L 7/00* (2013.01); *H01S 3/06791* (2013.01); *H01S 3/1305* (2013.01); *H01S 3/1307* (2013.01); *H01S 3/2391* (2013.01)

(56) References Cited

U.S. PATENT DOCUMENTS

| | | |
|---|---|---|
| 4,938,841 A | 7/1990 | Shahar et al. |
| 5,351,252 A | 9/1994 | Toyama et al. |
| 5,398,256 A | 3/1995 | Hohimer et al. |
| 5,723,856 A | 3/1998 | Yao et al. |
| 5,894,247 A | 4/1999 | Yoshida et al. |
| 6,008,931 A * | 12/1999 | von Helmolt .............. G01J 9/02 359/326 |
| 6,044,192 A | 3/2000 | Grant et al. |
| 6,535,328 B2 * | 3/2003 | Yao .................... H04B 10/2916 250/227.11 |
| 6,580,532 B1 | 6/2003 | Yao et al. |
| 6,594,061 B2 | 7/2003 | Huang et al. |
| 6,763,042 B2 | 7/2004 | Williams et al. |
| 6,865,348 B2 | 3/2005 | Miyamoto et al. |
| 6,891,864 B2 | 5/2005 | Vahala et al. |
| 6,895,133 B1 | 5/2005 | Calkins et al. |
| 7,085,499 B2 | 8/2006 | Yap et al. |
| 7,142,570 B2 | 11/2006 | Lee et al. |
| 7,187,871 B1 | 3/2007 | Kaushik |
| 7,260,279 B2 | 8/2007 | Gunn et al. |
| 7,272,160 B1 | 9/2007 | Geng et al. |
| 7,362,927 B1 * | 4/2008 | Ilchenko .................... G02F 1/21 385/15 |
| 7,515,617 B1 | 4/2009 | Vahala et al. |
| 7,590,326 B2 | 9/2009 | Fincato et al. |
| 7,616,850 B1 | 11/2009 | Watts et al. |
| 7,764,720 B1 | 7/2010 | Bronder et al. |
| 7,929,589 B1 | 4/2011 | Ilchenko et al. |
| 8,045,834 B2 | 10/2011 | Painter et al. |
| 8,094,987 B2 | 1/2012 | Armani |
| 8,102,597 B1 | 1/2012 | Maleki et al. |
| 8,103,175 B1 | 1/2012 | Kowalczyk et al. |
| 8,377,320 B2 | 2/2013 | Wang et al. |
| 8,451,528 B1 * | 5/2013 | Kuo .......................... G02F 1/07 359/264 |
| 8,620,158 B2 * | 12/2013 | Peach .............. H04B 10/25758 398/183 |
| 8,761,555 B2 | 6/2014 | Matsko et al. |
| 8,818,146 B2 | 8/2014 | Vahala et al. |
| 8,848,760 B2 | 9/2014 | Vahala et al. |
| 8,917,444 B2 | 12/2014 | Lee et al. |
| 9,042,003 B2 | 5/2015 | Li et al. |
| 9,178,520 B2 | 11/2015 | Witzens |
| 9,197,032 B2 | 11/2015 | Qiu et al. |
| 9,293,887 B2 | 3/2016 | Li et al. |
| 9,450,673 B2 | 9/2016 | Vahala et al. |
| 9,537,571 B2 * | 1/2017 | Li .............. H03L 7/08 |
| 9,595,918 B2 | 3/2017 | Li et al. |
| 2001/0014106 A1 | 8/2001 | Gevorgian et al. |
| 2001/0030796 A1 | 10/2001 | Yao |
| 2002/0181041 A1 | 12/2002 | Tong |
| 2004/0179573 A1 | 9/2004 | Armani et al. |
| 2005/0111776 A1 | 5/2005 | Martin et al. |
| 2005/0163185 A1 | 7/2005 | Vahala et al. |
| 2005/0169331 A1 | 8/2005 | Vahala et al. |
| 2006/0110926 A1 | 5/2006 | Hu et al. |
| 2006/0187537 A1 | 8/2006 | Huber et al. |
| 2007/0127930 A1 | 6/2007 | Prodanov et al. |
| 2007/0160093 A1 | 7/2007 | Nishizawa et al. |
| 2007/0230856 A1 | 11/2007 | Yamazaki |
| 2008/0075464 A1 | 3/2008 | Maleki et al. |
| 2008/0203052 A1 | 8/2008 | Hossein-Zadeh et al. |
| 2009/0028504 A1 | 1/2009 | Wu et al. |
| 2009/0079967 A1 | 3/2009 | Radic |
| 2009/0285542 A1 | 11/2009 | Armani et al. |
| 2011/0090936 A1 | 4/2011 | Kupershmidt |
| 2011/0103801 A1 | 5/2011 | Breunig et al. |
| 2011/0134940 A1 | 6/2011 | Hartog |
| 2012/0194901 A1 | 8/2012 | Bravo-Abad et al. |
| 2012/0320448 A1 | 12/2012 | Lee et al. |
| 2012/0321245 A1 | 12/2012 | Vahala et al. |
| 2013/0010819 A1 | 1/2013 | Ahmad et al. |
| 2013/0044975 A1 | 2/2013 | Schlarb et al. |
| 2013/0083813 A1 | 4/2013 | Hartog |
| 2013/0163620 A1 | 6/2013 | Lecoeuche |
| 2013/0215919 A1 | 8/2013 | Aflatouni et al. |
| 2014/0112357 A1 | 4/2014 | Abedin et al. |
| 2014/0152994 A1 | 6/2014 | Wu et al. |
| 2015/0092808 A1 | 4/2015 | Li et al. |
| 2015/0236784 A1 | 8/2015 | Vahala et al. |
| 2015/0236789 A1 | 8/2015 | Vahala et al. |
| 2015/0311662 A1 | 10/2015 | Vahala et al. |
| 2016/0190769 A1 | 6/2016 | Li et al. |
| 2017/0012705 A1 | 1/2017 | Vahala et al. |

FOREIGN PATENT DOCUMENTS

| | | |
|---|---|---|
| WO | 01/52368 A1 | 7/2001 |
| WO | 2013-063586 A1 | 5/2013 |
| WO | 2013/148757 A1 | 10/2013 |
| WO | 2013/184227 A1 | 12/2013 |
| WO | 2015/160413 A2 | 10/2015 |
| WO | 2015/163954 A2 | 10/2015 |
| WO | 2015/191124 A2 | 12/2015 |
| WO | 2016/138291 A2 | 9/2016 |

OTHER PUBLICATIONS

Agrawal, G.P. "Mode-partition noise intensity correlation is a two-mode semiconductor laser" Physical Review A vol. 37, No. 7 (1988) pp. 2488-2494.

Anetsberger, G., et al., Ultralow-dissipation optomechanical resonators on a chip, Nature Photonics 2008, 2: 627-633.

Aoki, T., et al., "Observation of strong coupling between one atom and a monolithic microresonator", Nature 2006, 443: 671-674.

Armani, D.K., et al. "Ultra-high-Q toroid microcavity on a chip." Nature, vol. 421, pp. 925-928, 2003.

Barwicz, T., et al., "Three-Dimensional Analysis of Scattering Losses Due to Sidewall Roughness in Microphotonic Waveguides", J. Lightwave Tech. 2005, 23: 2719-2732.

Bauters, J., et al. "Ultra-low-loss high-aspect-ratio Si3N4 waveguides", Optics Express 2011, 19: 3163-3164.

Braje, D., et al., "Brillouin-Enhanced Hyperparametric Generation of an Optical Frequency Comb in a Monolithic Highly Nonlinear Fiber Cavity Pumped by a cw Laser", Phys. Rev. Letters 2009, PRL 102: 193902-1-193902-4.

Cai, M., et al., "Observation of Critical Coupling in a Fiber Taper to a Silica-Microsphere Whispering-Gallery Mode System", Phys. Rev. Letters 2000, 85: 74-77.

Callahan, P.T. et al. "Frequency-independent phase noise in a dual-wavelength Brillouin fiber laser" IEEE J. Quantum Electron. 2011; vol. 47; pp. 1142-1150.

(56) References Cited

OTHER PUBLICATIONS

Carmon, T., et al., Dynamical thermal behavior and thermal self-stability of microcavities, Optics Express 2004, 12: 4742-4750.
Ciminelli, C., et al., "Photonic technologies for angular velocity sensing", Adv. Opt. & Photo. 2010, 2: 370-404.
Ciminelli, C., et al., "Three-dimensional modeling of scattering loss in InGaAsP/InP and silica-on-silicon bent waveguides", J. Europ. Opt. Society 2009, 4: 09015-1-09015-6.
Del'Haye, P. et al., Frequency comb assisted diode laser spectroscopy for measurement of microcavity . dispersion, Nature Photonics 2009, 3: 529-533.
Del'Haye, P., et al., Full Stabilization of a Microresonator-Based Optical Frequency Comb, Phys. Rev. Letters 2008, PRL 101: 053903-1-053903-4.
Del'Haye, P., et al., Octave Spanning Tunable Frequency Comb from a Microresontaor, Phys. Rev. Letters 2011, PRL 107: 063901-1-063901-4.
Del'Haye, P., et al., Optical frequency comb generation from a monolithic microresonator, Nature 2007, 450: 1214-1218.
Ex Parte Quayle Action dated Jul. 7, 2014 for U.S. Appl. No. 13/525,189 filed on Jun. 15, 2012 in the name of Jiang Li et al.
Ferdous, F., et al., Spectral line-by-line pulse shaping of on-chip microresonator frequency combs, Nature Photonics 2011, 5: 770-776.
Fortier, T.M., et al., Generation of ultrastable microwaves via optical frequency division, Nature Photonics 2011, 5: 425-429.
Foster, M., et al., "Silicon-based monolithic optical frequency comb source", Optics Express 2011, 19: 14233-14239.
Fujiwara, M. et al. "Flattened optical multicarrier generation of 12.5 GHz spaced 256 channels based on sinusoidal amplitude and phase hybrid modulation" IEEE Electron. Lett.; 2001; vol. 37; pp. 967-968.
Geng, J. et al. "Narrow Linewidth Fiber Laser for 100-km Optical Frequency Domain Reflectometry," IEEE Photon. Technol. Lett. 17, 1827-1929, 2005.
Gorodetsky, M., et al., "Fundamental thermal fluctuations in microspheres", J. Opt. Soc. Am. B 2004, 21: 697-705.
Gorodetsky, M.L., et al. "Ultimate Q of optical microsphere resonators." Optics Letters, vol. 21, No. 7, pp. 453-455, 1996.
Grudinin, I., et al., "Brillouin Lasing with a CaF2 Whispering Gallery Mode Resonator", Phys. Rev. Letters 2009, PRL 102: 043902-1-043902-4.
Grudinin, I., et al., "Generation of optical frequency combs with a CaF2 resonator", Optics Letters 2009, 34: 878-880.
Grudinin, I., et al., "On the fundamental limits of Q factor of crystalline dielectric resonators", Optics Express 2007, 15: 3390-3395.
Grudinin, I., et al., "Ultrahigh optical Q factors of crystalline resonators in the linear regime", Phys. Rev. Letters A 2006, 74: 063806-1-063806-9.
Hansch, T.W., et al., Laser Frequency Stabilization by Polarization Spectroscopy of a Reflecting Reference Cavity, Optics Comm. 1980, 35: 441-444.
Hossein-Zadeh, M. And Vahala, K.J. "Importance of Intrinsic-Q in Microring-Based Optical Filters and Dispersion-Compensation Devices." Photonics Technology Letters, vol. 19, Issue 14, pp. 1045-1047, 2007.
Illchenko, V.S., et al., Optical Resonators with Whispering-Gallery Modes—Part II: Applications, IEEE J. Selected Topics in Quna. Elec. 2006, 12: 15-32.
Ip, E., et al., Coherent detection in optical fiber systems, Optics Express 2008, 16: 753-821.
Johnson, A., et al., Chip-based frequency combs with sub-100 GHz repetition, Optics Letters 2012, 37: 875-877.
Karlsson, C., et al., All-fiber multifunction continuous-wave coherent laser radar at 1.55 μm for range, speed, vibration, and wind measurements, Applied Optics 2000, 39: 3716-31726.
Kasai, K., et al., 256-QAM (64 Gb/s) Coherent Optical Transmission Over 160 km With an Optical Bandwidth of 5.4 GHz, IEEE Phon. Tech. Letters 2010, 22: 185-187.

Kippenberg et al. "Fabrication and coupling to planar high-Q silica disk microcavities" Applied Physics Letters; 2003; vol. 83; No. 4; pp. 797-799.
Kippenberg, T.J, et al., Cavity Opto-Mechanics, Optics Express 2007, 15: 17172-17205.
Kippenberg, T.J, et al., Cavity Optomechanics: Back-Action at Mesoscale, Science 2008, 321: 1172-1176.
Kippenberg, T.J, et al., Microresonator-Based Optical Frequency Combs, Science 2011, 332: 555-559.
Kippenberg, T.J., et al. "Demonstration of an erbium-doped microdisk laser on a silicon chip." Physical Review A, vol. 74, Art. 051802, 2006.
Kippenberg, T.J., et al., Kerr-Nonlinearity Optical Parametric Oscillation in an Ultrahigh-Q Toroid Microcavity, Phys. Rev. Letters 2004, 93: 083904-1-083904-4.
Kohtoku, M., et al. "New Waveguide Fabrication Techniques for Next-generation PLCs." NTT Technical Review, vol. 3, No. 7, pp. 37-41, 2005.
Kominato, Extremely Low-loss (0.3 dB/m) and Long Silica-Based Waveguides with Large Widtth and Clothoid Curve Connection, ECOC Proceedings 2004, 2: pps. 1-2.
Lee, H. et al. "Ultra-Low-Loss Optical Delay Line on a Silicon Chip." 7 pgs. Mar. 20, 2012.
Lee, H., et al., Ultra-high-Q wedge-resonator on a silicon chip, arXiv: 1112.2196v1 2011, pps. 1-5.
Lee, H., Chen, T., Li, J., Yang, K. Y., Jeon, S., Painter, O., and Vahala, K. J., "Chemically etched ultrahigh-Q wedge resonator on a silicon chip," Nat. Photon. 6, 369-373 (2012).
Levy, J., et al., CMOS-compatible multiple-wavelength oscillator for on-chip optical interconnects, Nature Photonics 2009, 4: 37-40.
Li, J., Lee, H., Chen, T., and Vahala, K. J., "Characterization of a high coherence, brillouin microcavity laser on silicon," Opt. Express 20, 20170-20180 (2012).
Li, J. et al. "Chip-Based Frequency Combs with Microwave Repetition Rate." 6 pgs. Mar. 28, 2012.
Li, J., et al., Chip-based Brillouin lasers as spectral purifiers for photonic systems, arXiv:1201.4212 2011, pps. 1-5.
Li, J., et al., Highly Coherent, Microcavity Brillouin Laser on Silicon, FIO/LS Tech. Digest 2011, pps. 1-2.
Li, J., et al., Low-Pump-Power, Low-Phase-Noise, and Microwave to Millimeter-Wave Repetition Rate Operation in Microcombs, Physical Review Letters 2012, 109: 233901-1-233901-5.
Lu, T., et al., Frequency Noise of a Microchip Raman Laser, CLEO 2009, pps. 1-2.
Lu., T., et al., High sensitivity nanoparticle detection using optical microcavities, PNAS 2011, 108: 5976-5979.
Lytollis J., et al. "Infra-red optical communication systems." Infrared Physics, vol. 8, Issue 1, pp. 123- 129; 1968.
Matsko, A., et al., Optical Resonators with Whispering Gallery-Gallery Modes-Part I: Basics, IEEE J. Selected Topics in Quna. Elec. 2006, 12: 3-14.
Matsko, A. et al., Whispering-gallery-mode resonators as frequency references. I. Fundamental limitations, J. Opt. Soc. Am. B 2007, 24: 1324-1335.
Non-Final Office Action dated May 3, 2011 for U.S. Appl. No. 12/436,935 filed on May 7, 2009 in the name of Andrea Martin Armani et al.
Non-Final Office Action dated Sep. 1, 2011 for U.S. Appl. No. 13/033,391 filed on Feb. 23, 2011 in the name of Andrea Martin Armani et al.
Notice of Allowance issued for U.S. Appl. No. 12/436,935 filed on May 7, 2009 in the name of Andrea Martin Armani dated: Jul. 26, 2011.
Notice of Allowance dated Jan. 30, 2015 for U.S. Appl. No. 14/513,058 filed on Oct. 13,2014 in the name of California Institute of Technology.
Notice of Allowance dated Jun. 16, 2014 for U.S. Appl. No. 13/494,707 filed on Jun. 12, 2012 in the name of Kerry Vahala et al.
Notice of Allowance dated Nov. 25, 2011 for U.S. Appl. No. 13/033,391 filed on Feb. 23, 2011 in the name of Andrea Martin Armani et al.
Notice of Allowance dated Sep. 8, 2014 for U.S. Appl. No. 13/525,189 filed on Jun. 15, 2012 in the name of Jiang Li et al.

(56) References Cited

OTHER PUBLICATIONS

Okai, M., et a., Strained multiquantum-well corrugation-pitch-modulated distributed feedback laser with ultranarrow (3.6 kHz) spectral linewidth, Elec. Letters 1993, 29: 1696-.

Okawachi, Y., et al., Octave-spanning frequency comb generation in a silicon nitride chip, Optics Letters 2011, 36: 3398-3400.

Okawachi, Y., et al., Tunable All-Optical Delays via Brillouin Slow Light in an Optical Fiber, Phys. Rev. Letters 2005, PRL 94: 153902-1-153902-4.

Pant, R., et al., Cavity enhanced stimulated Briollouin scattering in an optical chip for multiorder Stokes generation, Optics Letters 2011, 36: 3687-3689.

Papp, S.B. et al. "Spectral and temporal characterization of a fused-quartz-microresonator optical frequency comb" Physical Review A, vol. 84, pp. 053833-1-053833-7 (2011).

Payne, S., et al., A theoretical analysis of scattering loss from planar optical waveguides, Opt. and Quan. Elec. 1994, 26: 977-986.

Poulsen, M.R. et al., "Advances in silica-based integrated optics." Opt. Eng., vol. 42, 2821-2834, Oct. 2003.

Quinlan, F., et al., A 12.5 GHz-spaced optical frequency comb spanning >400 nm for near-infrared astronomical spectrograph calibration, Rev. Sci. Instr. 2010, 81: 063105-1-063105-9.

Rafac, R.J., et al., Sub-dekahertz Ultraviolet Spectroscopy of 199 Hg+, Phys. Rev. Letters 2000, 85: 2462-2465.

Razzari, L., et al., CMOS-compatible integrated optical hyper-parametric oscillator, Nat. Phon. 2009, 4: 41-45.

Restriction Requirement issued for U.S. Appl. No. 12/436,935 filed on May 7, 2009 in the name of Andrea Martin Armani dated: Dec. 29, 2010.

Restriction Requirement dated Aug. 15, 2014 for U.S. Appl. No. 13/525,147 filed on Jun. 15, 2012 in the name of Jiang Li et al.

Restriction Requirement dated May 31, 2014 for U.S. Appl. No. 13/525,189 filed on Jun. 15, 2012 in the name of Jiang Li et al.

Savchenkov, A., et al., Low Threshold Optical Oscillations in a Whispering Gallery Mode CaF2 Resonator, Phys. Rev. Letters 2004, PRL 93: 243905-1-243905-4.

Savchenkov, A., et al., Optical resonators with ten million finesse, Optics Express 2007, 15: 6768-6773.

Savchenkov, A., et al., Tunable Optical Frequency Comb with a Crystalline Whispering Gallery Mode Resonator, Phys. Rev. Letters 2008, PRL 101: 093902-1-093902-4.

Savchenkov, A., et al., Whispering-gallery-mode resonators as frequency references. II. Stabilization, J. Opt. Soc. Am. B 2007, 24: 2988-2997.

Savory, S., et al., Laser Linewidth Requirements for Optical DQPSK Systems, IEEE Photo. Tech. Letters 2004, 16: 930-932.

Schawlow, A.L., et al., Infrared and Optical Masers, Phys. Rev. 1958, 112: 1940-1949.

Schliesser, A., et al., Resolved-sideband cooling of a micromechanical oscillator, Nature Physics 2008, 4: 415-419.

Shi, J.W., et al., High-Speed, High-Responsivity, and High-Power Performance of Near-Ballistic Uni-Traveling-Carrier Photodiode at 1.55 μm Wavelength, IEEE Photo. Tech. Letters 2005, 17: 1929-1931.

Smith, S.P., et al., Narrow-linewidth stimulated Brillouin fiber laser and applications, Optics Letters 1991, 16: 393-395.

Spillane, S.M., et al., Ideality in a Fiber-Taper-Coupled Microresonator System for Application to Cavity Quantum Electrodynamics, Phys. Rev. Letters 2003, 91: 043902-1-043902-4.

Spillane, S.M., et al., Ultralow-threshold Raman laser using a spherical dielectric microcavity, Nature 2002, 415: 621-623.

Syms, R.R.A. et al., "Reflow and Burial of Channel Waveguides Formed in Sol-Gel Glass on Si Substrates." IEEE Photonics Technology Letters, vol. 5, No. 9, 1077-1079, Sep. 1993.

Tien, M.C., et al., Ultra-high quality factor planar Si3N4 ring resonators on Si substrates, Optics Express 2011, 19: 13551-13556.

Tkach, RW, et al., Spontaneous Brillouin Scattering for Single-Mode Optical-Fibre Characterisation, Elec. Letters 1986, 22: 1011-1013.

Tomes, M., et al., Photonic Micro-Electromechanical Systems Vibrating at X-band (11-GHz) Rates, Phys. Rev. Letters 2009, PRL 102: 113601-1-113601-4.

Udem, Th., et al., Optical frequency metrology, Nature 2002, 416: 233-237.

Vahala, K., et al., Semiclassical Theory of Noise in Semiconductor Lasers—Part I, IEEE J. Quan. Elec. 1983, QE-19: 1096-1101.

Vahala, K.J. Optical microcavities, Nature, vol. 424, No. 6950, pp. 839-846, 2003.

Veroony, D.W., et al., High-Q measurements of fused-silica microspheres in the near infrared, Optics Express 1998, 23: 247-249.

Vollmer, F., et al., Whispering-gallery-mode biosensing: label-free detection down to single molecules, Nature Methods 2008, 5: 591-596.

Xu et al. "Archimedean spiral cavity ring resonators in silicon as ultra-compact optical comb filters" Optics Express. vol. 18; No. 3; pp. 1937-1945. 2010.

Yang, L., et al., A 4-Hz Fundamental Linewidth on-chip Microlaser, CLEO 2007, pps. 1-2.

Young, B.C., et al., Visible Lasers with Subhertz Linewidths, Phys. Rev. Letters 1999, 82: 3799-3802.

Zhu, Z., et al., Broadband SBS Slow Light in an Optical Fiber, J. Lightwave Tech. 2007, 25: 201-206.

Zhu, Z., et al., Stored Light in an Optical Fiber via Stimulated Brillouin Scattering, Science 2007, 318: 1748-1750.

Alnis et al. "Thermal-noise limited laser stabilization to a crystalline whispering-gallery-mode resonator" arXiv:1102.4227v1 (Feb. 21, 2011).

Black. "An introduction to Pound-Drever-Hall laser frequency stabilization" American Journal of Physics. vol. 69; No. 1; p. 79. (2001).

Carpintero, G. et al. "95 GHz millimeter wave signal generation using an arrayed waveguide grating dual wavelength semiconductor laser" Opt. Lett. 2012; vol. 37; pp. 3657-3659.

Debut, a. et al. "Linewidth narrowing in Brillouin lasers: theoretical analysis" Phys. Rev.; 2000; A62 023803 4 pages.

Dreyer et al. "Laser phase and frequency stabilization using an optical resonator" Appl. Phys. B; 1983; vol. 31; No. 2; p. 97.

Dudley, J.M. et al. "Supercontinuum generation in photonic crystal fiber" Rev. Mod. Phys. 2006; vol. 78; pp. 1135-1184.

Fujiwara, M. et al. "Flattened optical multicarrier generation of 12.5 GHz spaced 256 channels based on . smusotdal amplitude and phase hybrid modulation" IEEE Electron. Lett.; 2001; vol. 37; pp. 967-968.

Geng, J. et al. "Dual-frequency Brillouin fiber laser for optical generation of tunable low-noise radio frequency/microwave frequency" Opt. Lett.; 2008; vol. 33; pp. 16-18.

Geng, J. et al. "Highly stable low-noise Brillouin fiber laser with ultranarrow spectral linewidth" IEEE Photonics Technology Letters; 2006; vol. 18; pp. 1813-1815.

Goldberg, L. et al. "Microwave signal generation with injection locked laser diodes" Electron. Lett.; 1983; vol. 19; pp. 491-493.

Gross, M. et al. "Tunable millimeter-wave frequency synthesis up to 100 GHz by dual-wavelength Brillouin fiber laser" Opt. Express. 2010; vol. 18; pp. 13321-13330.

Huang, C.B. et al. "Nonlinearly broadened phase-modulated continuous-wave laser frequency combs characterized using Dpsk decoding" Opt. Express; 2008; vol. 16; pp. 2520-2527.

International Preliminary Report on Patentability for International Application PCT/US2013/032717. Dated: Dec. 9, 2014.

International Search Report and Written Opinion for International Application PCT/US2013/032717. Dated: Jul. 26, 2013.

International Search Report and Written Opinion for International Application PCT/US2015/012962. Dated: Nov. 12, 2015.

International Search Report and Written Opinion for International Application PCT/US2015/012964. Dated: Nov. 12, 2015.

International Search Report and Written Opinion for International Application PCT/US2015/019080. Dated: Dec. 29, 2015.

Ishizawa, a. et al. "Phase-noise characteristics of a 25-GHz-spaced optical frequency comb based on a phase- and intensity-modulated laser" Opt. Express; 2013; vol. 21; pp. 29186-29194.

(56) References Cited

OTHER PUBLICATIONS

Ivanov, E.N. et al. "Study of the Excess Noise Associated with Demodulation of Ultra-Short Infrared Pulses" IEEE Trans. Ultrason. Ferroelectr. Freq. Control; 2005; vol. 52; pp. 1068-1074.
Kessler, T. et al. "A sub-40-mHz-linewidth laser based on a silicon single-crystal optical cavity" Nat. Photon. 2012; vol. 6; pp. 687-692.
Li, J. et al. "Electro-optical frequency division and stable microwave synthesis" Science; 2014; vol. 345; pp. 309-313.
Li, J. et al. "Low-noise Brillouin laser on a chip at 1064 nm"; Optics Letters; 2014; vol. 39; pp. 287-290.
Li, J. et al. "Microwave synthesizer using an on-chip Brillouin oscillator" Nat. Commun. 2013; vol. 4; p. 2097.
Li, J. et al. "Sideband spectroscopy and dispersion measurement in microcavities" Opt. Exp. 2012; vol. 20; pp. 26337-26344.
Metcalf, a.J. et al. "High-power broadly tunable electro-optic frequency comb generator" IEEE J. Sel. Top. Quantum Electron. 2013; vol. 19 pp. 3500306.
Morohashi, I. et al. "Broadband wavelength-tunable ultrashort pulse source using a Mach-Zehnder modulator and dispersion-flattened dispersion-decreasing fiber" Opt. Lett.; 2009; vol. 34; pp. 2297-2299.
Murata, H. et al. "Optical pulse generation by electrooptic-modulation method and its application to integraged ultrashort pulse generators" IEEE J. Sel. Top. Quantum Electron. 2000; vol. 6; pp. 1325.
Pan. S. et al. "A wavelength-switchable single-longitudinal-mode dual-wavelength erbium-doped fiber laser for switchable microwave generation" Opt. Express; 2009; vol. 17; pp. 5414-5419.
Papp, S.B. et al. "A microresonator frequency comb optical clock" arXiv: 1309.3525 (2013).
Pillet, G. et al. "Dual frequency laser at 1.5 μm for optical distribution and generation of high-purity microwave signals" J. Lightwave Technol. 2008; vol. 26; pp. 2764-2773.
Rolland, A. et al. "Non-linear optoelectronic phase-locked loop for stabilization of opto-millimeter waves: towards a narrow linewidth THz source" Opt. Express; 2011; vol. 19; pp. 17944-17950.
Sakamoto, T. et al. "Asymptotic formalism for ultraflat optical frequency comb generation using a Mach-Zehnder modulator" Opt. Lett. 2007; vol. 32; pp. 1515-1517.
Schneider, G.J. et al. "Radio frequency signal-generation system with over seven octaves of continuous tuning" Nat. Photon. 2013; vol. 7; pp. 118-122.
Seeds, A.J. et al. "Microwave Photonics" Lightwave Technology; 2006; vol. 24; pp. 4628-4641.
Shee, Y.G. et al. "All-optical generation of a 21 GHz microwave carrier by incorporating a double-Brillouin frequency shifter" Opt. Lett.; 2010; vol. 35; pp. 1461-1463.
Shee, Y.G. et al. "Millimeter wave carrier generation based on a double-Brillouin-frequency spaced fiber laser" Opt. Express; 2012; vol. 20; pp. 13402-13408.
Suzuki, S. et al. "12.5 GHz Near-IR Frequency Comb Generation Using Optical Pulse Synthesizer for Extra-Solar Planet Finder" Nonlinear Optics, OSA Tehnical Digest: Nonlinear Optics Conference; Optical Society of America 2013.
Swann, W. et al. "Microwave generation with low residual phase noise from a femtosecond fiber laser with an intracavity electro-optic modulator" Opt. Express; 2011; vol. 19; pp. 24387-24395.
Taylor, J. et al. "Characterization of Power-to-Phase Conversion in High-Speed P-I-N. Photodiodes" IEEE Photonics Journal; 2011; vol. 3; p. 140.
Xu et al. "Folded cavity SOI microring sensors for high sensitivity and real time measurment of . biomolecular binding" Optics Express. 16, 15137 (2008).
Yao, J., "Microwave Photonics" Lighwave Technology; 2009; vol. 27; pp. 314-335.
Notice of Allowance for U.S. Appl. No. 14/605,977 filed Jan. 26, 2015 on behalf of Kerry Vahala. Dated May 13, 2016. 18 pages.
Notice of Allowance for U.S. Appl. No. 14/831,692 filed Mar. 15, 2013 on behalf of Kerry Vahala. Dated Mar. 31, 2014. 8 pages.
Final Office Action issued for U.S. Appl. No. 15/018,824, filed Feb. 8, 2016, on behalf of California Institute of Technology. Dated May 18, 2017. 17 pages.
International Preliminary Report on Patentability issued for International Patent Application No. PCT/US2015/012964, filed Jan. 26, 2015 on behalf of California Institute of Technology. Dated Jul. 26, 2016. 5 pages.
International Preliminary Report on Patentability issued for International Patent Application No. PCT/US2016/019608, filed Feb. 25, 2016, on behalf of California Institute of Technology. Dated Sep. 8, 2017. 8 pages.
International Search Report and Written Opinion issued for International Patent Application No. PCT/US2016/019608, filed Feb. 25, 2016, on behalf of California Institute of Technology. Dated Jun. 29, 2016. 11 pages.
Non-Final Office Action issued for U.S. Appl. No. 13/525,147, filed Jun. 15, 2012, on behalf of California Institute of Technology. Dated Jan. 13, 2015. 26 pages.
Non-Final Office Action issued for U.S. Appl. No. 15/018,824, filed Feb. 8, 2016, on behalf of California Institute of Technology. Dated Oct. 3, 2016. 17 pages.
Non-Final Office Action issued for U.S. Appl. No. 14/513,058, filed Oct. 13, 2014, on behalf of California Institute of Technology. Dated Nov. 25, 2014. 9 pages.
Non-Final Office Action issued for U.S. Appl. No. 14/605,987, filed Jan. 26, 2015, on behalf of California Institute of Technology. Dated May 12, 2016. 25 pages.
Notice of Allowance issued for U.S. Appl. No. 13/525,147, filed Jun. 15, 2012, on behalf of California Institute of Technology. Dated Sep. 10, 2015. 11 pages.
Notice of Allowance issued for U.S. Appl. No. 13/525,147, filed Jun. 15, 2012, on behalf of California Institute of Technology. Dated Nov. 12, 2015. 13 pages.
Notice of Allowance issued for U.S. Appl. No. 14/640,031, filed Mar. 6, 2015, on behalf of California Institute of Technology. Dated Nov. 3, 2016. 23 pages.
Notice of Allowance issued for U.S. Appl. No. 14/605,987, filed Jan. 26, 2015, on behalf of California Institute of Technology. Dated Aug. 26, 2016. 11 pages.
Search Report issued for European Patent Application No. 15780751, filed Jan. 26, 2015, on behalf of California Institute of Technology. Dated Jul. 20, 2017. 8 pages.
Search Report issued for European Patent Application No. 15783006, filed Jan. 26, 2015, on behalf of California Institute of Technology. Dated Jul. 27, 2017. 7 pages.
Rolland, Antoine, et al. "Non-linear optoelectronic phase-locked loop for stabilization of optomillimeter waves: towards a narrow linewidth tunable THz source." Optics express 19.19 (2011): 1794-17950.†
Del'Haye, Pascal, Scott B. Papp, and Scott A. Diddams. "Hybrid electro-optically modulated microcombs." Physical review letters 109.26 (2012): 263901.†

\* cited by examiner
† cited by third party

OPTICAL FREQUENCY DIVIDER BASED ON AN ELECTRO-OPTICAL-MODULATOR FREQUENCY COMB

BENEFIT CLAIMS TO RELATED APPLICATIONS

This application claims benefit of U.S. provisional App. No. 62/121,257 entitled "Optical Frequency Divider Based on Electro-Optical-Modulator Comb" filed Feb. 26, 2015 in the names of Jiang Li and Kerry Vahala, said provisional application being hereby incorporated by reference as if fully set forth herein.

STATEMENT REGARDING FEDERALLY SPONSORED RESEARCH

This invention was made with government support under Grant No. FA9550-10-1-0284 awarded by the Air Force and under Grant No. W31P4Q-14-1-0001 awarded by the Army. The government has certain rights in the invention.

FIELD OF THE INVENTION

The field of the present invention relates to generating microwave-frequency electrical signals and microwave-frequency sources utilizing a dual optical-frequency source and optical frequency division.

BACKGROUND

Subject matter disclosed or claimed herein may be related to subject matter disclosed in:

- L. Goldberg, H. F. Taylor, J. F. Weller, and D. M. Bloom, "Microwave signal generation with injection locked laser diodes," Electron. Lett. 19, 491-493 (1983);
- Pillet, G., Morvan, L., Brunel, M., Bretenaker, F., Dolfi, D., Vallet, M., Huignard, J.-P., and Le Floch, A., "Dual frequency laser at 1.5 µm for optical distribution and generation of high-purity microwave signals," J. Lightwave Technol. 26, 2764-2773 (2008);
- Schneider, G. J., Murakowski, J. A., Schuetz, C. A., Shi, S., and Prather, D. W., "Radio frequency signal-generation system with over seven octaves of continuous tuning," Nat. Photon. 7, 118-122 (2013);
- Li, J., Lee, H., and Vahala., K. J., "Microwave synthesizer using an on-chip Brillouin oscillator," Nat. Commun. 4, 2097 (2013);
- Fortier, T., et al., "Generation of ultrastable microwaves via optical frequency division," Nat. Photon. 5, 425-429 (2011);
- H. Murata, A. Morimoto, T. Kobayashi, and S. Yamamoto, "Optical Pulse Generation by Electrooptic-Modulation Method and Its Application to Integrated Ultrashort Pulse Generators," IEEE J. Sel. Top. Quantum Electron. 6, 1325 (2000);
- M. Fujiwara, J. Kani, H. Suzuki, K. Araya, M. Teshima, "Flattened optical multicarrier generation of 12.5 GHz spaced 256 channels based on sinusoidal amplitude and phase hybrid modulation," IEEE Electron. Lett. 37, 967-968 (2001);
- A. J. Metcalf, V. Torres-Company, D. E. Leaird, and A. M. Weiner, "High-power broadly tunable electro-optic frequency comb generator," IEEE J. Sel. Top. Quantum Electron. 19, p 231-236, 3500306 (2013);
- A. Rolland, G. Loas, M. Brunel, L. Frein, M. Vallet, and M. Alouini, "Non-linear optoelectronic phase-locked loop for stabilization of opto-millimeter waves: towards a narrow linewidth tunable THz source," Opt. Express 19, 17944-17950 (2011);
- William C. Swann, Esther Baumann, Fabrizio R. Giorgetta, and Nathan R. Newbury, "Microwave generation with low residual phase noise from a femtosecond fiber laser with an intracavity electro-optic modulator," Opt. Express 19, 24387-24395 (2011);
- Papp, S. B., Beha, K., DelHaye, P., Quinlan, F., Lee, H., Vahala, K. J., Diddams, S. A., "A microresonator frequency comb optical clock," arXiv:1309.3525 (2013), Optica Vol. 1, Issue 1, pp. 10-14 (2014);
- C. B. Huang, S. G. Park, D. E. Leaird, and A. M. Weiner, "Nonlinearly broadened phase-modulated continuous-wave laser frequency combs characterized using DPSK decoding," Opt. Express 16, 2520-2527 (2008);
- I. Morohashi, T. Sakamoto, H. Sotobayashi, T. Kawanishi, and I. Hosako, "Broadband wavelength-tunable ultrashort pulse source using a Mach-Zehnder modulator and dispersion-flattened dispersion-decreasing fiber," Opt. Lett. 34, 2297-2299 (2009);
- A. Ishizawa, T. Nishikawa, A. Mizutori, H. Takara, A. Takada, T. Sogawa, and M. Koga, "Phase-noise characteristics of a 25-GHz-spaced optical frequency comb based on a phase- and intensity-modulated laser," Opt. Express 21, 29186-29194 (2013);
- S. Suzuki, K. Kashiwagi, Y. Tanaka, Y. Okuyama, T. Kotani, J. Nishikawa, H. Suto, M. Tamura, and T. Kurokawa, "12.5 GHz Near-IR Frequency Comb Generation Using Optical Pulse Synthesizer for Extra-Solar Planet Finder," in Nonlinear Optics, OSA Technical Digest: Nonlinear Optics Conference (Optical Society of America, 2013), paper NM3A.3;
- Young, B., Cruz, F., Itano, W., and Bergquist, J., "Visible Lasers with Subhertz Linewidths," Phys. Rev. Lett. 82, 3799-3802 (1999);
- T. Kessler, C. Hagemann, C. Grebing, T. Legero, U. Sterr, F. Riehle, M. J. Martin, L. Chen, and J. Ye., "A sub-40-mHz-linewidth laser based on a silicon single-crystal optical cavity," Nat. Photon. 6, 687-692 (2012);
- Lee, H., Chen, T., Li, J., Yang, K. Y., Jeon, S., Painter, O., and Vahala, K. J., "Chemically etched ultrahigh-Q wedge resonator on a silicon chip," Nat. Photon. 6, 369-373 (2012);
- Li, J., Lee, H., Chen, T., and Vahala, K. J., "Characterization of a high coherence, brillouin microcavity laser on silicon," Opt. Express 20, 20170-20180 (2012);
- J. Li, H. Lee, K. Y. Yang, and K. J. Vahala, "Sideband spectroscopy and dispersion measurement in microcavities," Opt. Exp. 20, 26337-26344 (2012);
- Drever, R., Hall, J. L., Kowalski, F., Hough, J., Ford, G., Munley, A., and Ward, H., "Laser phase and frequency stabilization using an optical resonator," Appl. Phys. B 31, 97-105 (1983);
- Gross, M. C., Callahan, P. T., Clark, T. R., Novak, D., Waterhouse, R. B., and Dennis, M. L., "Tunable millimeter-wave frequency synthesis up to 100 GHz by dual-wavelength Brillouin fiber laser," Opt. Express 18, 13321-13330 (2010);
- Callahan, P. T., Gross, M. C., and Dennis, M. L., "Frequency-independent phase noise in a dual-wavelength Brillouin fiber laser," IEEE J. Quantum Electron. 47, 1142-1150 (2011);
- T. Sakamoto, T. Kawanishi, and M. Izutsu, "Asymptotic formalism for ultraflat optical frequency comb generation using a Mach-Zehnder modulator," Opt. Lett. 32, 1515-1517 (2007);

Dudley, J. M., Genty, G., Coen, Stephane, "Supercontinuum generation in photonic crystal fiber," Rev. Mod. Phys. 78, 1135-1184 (2006);

Li, J., Yi, X., Lee, H., Diddams, S., and Vahala, K., "Electro-optical frequency division and stable microwave synthesis," Science 345, 309-313;

Geng, J., Staines, S., and Jiang, S., "Dual-frequency Brillouin fiber laser for optical generation of tunable low-noise radio frequency/microwave frequency," Opt. Lett. 33, 16-18 (2008);

Pan, S., and Yao, J., "A wavelength-switchable single-longitudinal-mode dual-wavelength erbium-doped fiber laser for switchable microwave generation," Opt. Express 17, 5414-5419 (2009);

Taylor, J., Datta, S., Hati, A., Nelson, C., Quinlan, F., Joshi, A., and Diddams, S., "Characterization of Power-to-Phase Conversion in High-Speed P-I-N Photodiodes," IEEE Photonics Journal 3, 140 (2011);

A. J. Seeds, K. J. Williams, J., Lightwave Technol. 24, 4628-4641 (2006).

J. Yao, J. Lightwave Technol. 27, 314-335 (2009);

G. Carpintero et al., Opt. Lett. 37, 3657-3659 (2012);

U. L. Rohde, Microwave and Wireless Synthesizers: Theory and Design (Wiley, New York, 1997);

E. N. Ivanov, S. A. Diddams, L. Hollberg, IEEE Trans. Ultrason. Ferroelectr. Freq. Control 52, 1068-1074 (2005);

J. Li, H. Lee, K. J. Vahala, Opt. Lett. 39, 287-290 (2014);

U.S. Pat. Pub. No. 2015/0236784 entitled "Stabilized microwave-frequency source" published Aug. 20, 2015 in the names of Vahala, Diddams, Li, Yi, and Lee;

U.S. Pat. Pub. No. 2015/0236789 entitled "Dual-frequency optical source" published Aug. 20, 2015 in the names of Vahala and Li; and U.S. Pat. Pub. No. 2015/0311662 entitled "Stable microwave-frequency source based on cascaded brillouin lasers" published Oct. 29, 2015 in the names of Vahala and Li.

Each of the references listed above is incorporated by reference as if fully set forth herein.

SUMMARY

A microwave-frequency source for generating an output electrical signal at an output frequency $f_M$ comprises: a dual optical-frequency reference source, an electro-optic sideband generator, one or both of first and second optical bandpass filters, one or both of first and second optical detectors, a reference oscillator, an electrical circuit, and a voltage-controlled electrical oscillator. The dual optical-frequency reference source is arranged so as to generate (i) a first optical reference signal at a first optical reference frequency $v_1$ and (ii) a second optical reference signal at a second optical reference frequency $v_2 > v_1$. The electro-optic sideband generator is arranged so as to (i) receive a third optical reference signal at a third optical reference frequency $v_0$ and a sideband generator input electrical signal at the frequency $f_M$ and (ii) generate therefrom multiple sideband optical signals at respective sideband optical frequencies of the form $v_0 \pm nf_M$, wherein n is an integer. The first optical bandpass filter is arranged so as to transmit the first optical reference signal and a subset of the multiple sideband optical signals including the sideband optical signal at a frequency $v_0 - Nf_M$, wherein $N_1$ is an integer; the second optical bandpass filter is arranged so as to transmit the second optical reference signal and a subset of the multiple sideband optical signals including the sideband optical signal at a frequency $v_0 + N_2 f_M$, wherein $N_2$ is an integer. The first optical detector is arranged so as to receive the optical signals transmitted by the first optical bandpass filter and to generate therefrom a first optical detector electrical signal at a first beat frequency $f_{BEAT1} = |v_1 - (v_0 - N_1 f_M)|$; the second optical detector is arranged so as to receive the optical signals transmitted by the second optical bandpass filter and to generate therefrom a second optical detector electrical signal at a second beat frequency $f_{BEAT2} = |v_2 - (v_0 + N_2 f_M)|$.

The reference oscillator is arranged so as to generate a reference oscillator electrical signal at a reference oscillator frequency $f_R$. The electrical circuit is arranged so as to receive the reference oscillator electrical signal and only one of (A) the first optical detector electrical signal, (B) the second optical detector electrical signal, or (C) a difference electrical signal generated from the first and second optical detector electrical signals by an electrical mixer at an electrical difference frequency $f_{DIFF} = f_{BEAT2} - f_{BEAT1} = |v_2 - v_1 - (N_1 + N_2) \cdot f_M|$. The electrical circuit is further arranged so as to generate from the received electrical signals, using a comparator portion of the electrical circuit, an electrical error signal dependent on relative phase of the electrical signals received by the electrical circuit, and to process the electrical error signal using a loop-filter portion of the electrical circuit. The voltage-controlled electrical oscillator is arranged so as to (i) receive the loop-filtered electrical error signal as a VCO input electrical signal and (ii) generate a VCO output electrical signal at the frequency $f_M$, wherein a first portion of the VCO output electrical signal is received by the electro-optic sideband generator as the sideband generator input electrical signal and a second portion of the VCO output electrical signal forms the output electrical signal of the microwave-frequency source. Reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

Using the microwave-frequency source, a method for generating a microwave-frequency output electrical signal at the output frequency $f_M$ comprises: (a) generating the first and second optical reference signals; (b) generating the multiple sideband optical signals; (c) transmitting through one or both of the first or second optical bandpass filters one or both of the first or second optical reference signals and one or both of the first or second subsets of the multiple sideband optical signals; (d) generating one or both of the first or second optical detector electrical signals; (e) generating the reference oscillator electrical signal at a reference oscillator frequency $f_R$; (f) generating and processing the electrical error signal; and (g) receiving the loop-filtered electrical error signal and generating the VCO output electrical signal at the frequency $f_M$.

In some examples, the third optical reference frequency $v_0$ differs from the first optical reference frequency $v_1$ and from the second optical reference frequency $v_2$. The first optical bandpass filter transmits the first optical reference signal and the sideband optical signal at a frequency $v_0 - N_1 f_M$, and the first optical detector generates from those transmitted optical signals the first optical detector electrical signal at the first beat frequency $f_{BEAT1} = |v_1 - (v_0 - N_1 f_M)|$. The second optical bandpass filter transmits the second optical reference signal and the sideband optical signal at a frequency $v_0 + N_2 f_M$, and the second optical detector generates from those transmitted optical signals the second optical detector electrical signal at the second beat frequency $f_{BEAT2} = |v_2 - (v_0 + N_2 f_M)|$. The electrical circuit generates the electrical error signal from the reference oscillator electrical signal and the difference electrical signal at the electrical difference frequency $f_{DIFF}=f_{BEAT2}-f_{BEAT1}=|v_2-v_1-(N_1+N_2)\cdot f_M|$.

In other examples, a portion of the first optical reference signal serves as the third optical reference signal so that $v_0=v_1$; the multiple sideband optical signals are generated at respective sideband optical frequencies of the form $v_1 \pm nf_M$, wherein n is an integer. The second optical bandpass filter transmits the second optical reference signal and the sideband optical signal at a frequency $v_1+N_2 f_M$, and the second optical detector generates from those transmitted optical signals the second optical detector electrical signal at the second beat frequency $f_{BEAT2}=|v_2-(v_1+N_2 f_M)|$. The electrical circuit generates the electrical error signal from the reference oscillator electrical signal and the second optical detector electrical signal.

In still other examples, a portion of the second optical reference signal serves as the third optical reference signal so that $v_0=v_2$; the multiple sideband optical signals are generated at respective sideband optical frequencies of the form $v_2 \pm nf_M$, wherein n is an integer. The first optical bandpass filter transmits the first optical reference signal and the sideband optical signal at a frequency $v_2-N_1 f_M$, and the first optical detector generates from those transmitted optical signals the first optical detector electrical signal at the first beat frequency $f_{BEAT1}=|v_1-(v_2-N_1 f_M)|$. The electrical circuit generates the electrical error signal from the reference oscillator electrical signal and the first optical detector electrical signal.

Objects and advantages pertaining to optical frequency dividers and optical frequency combs may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1:
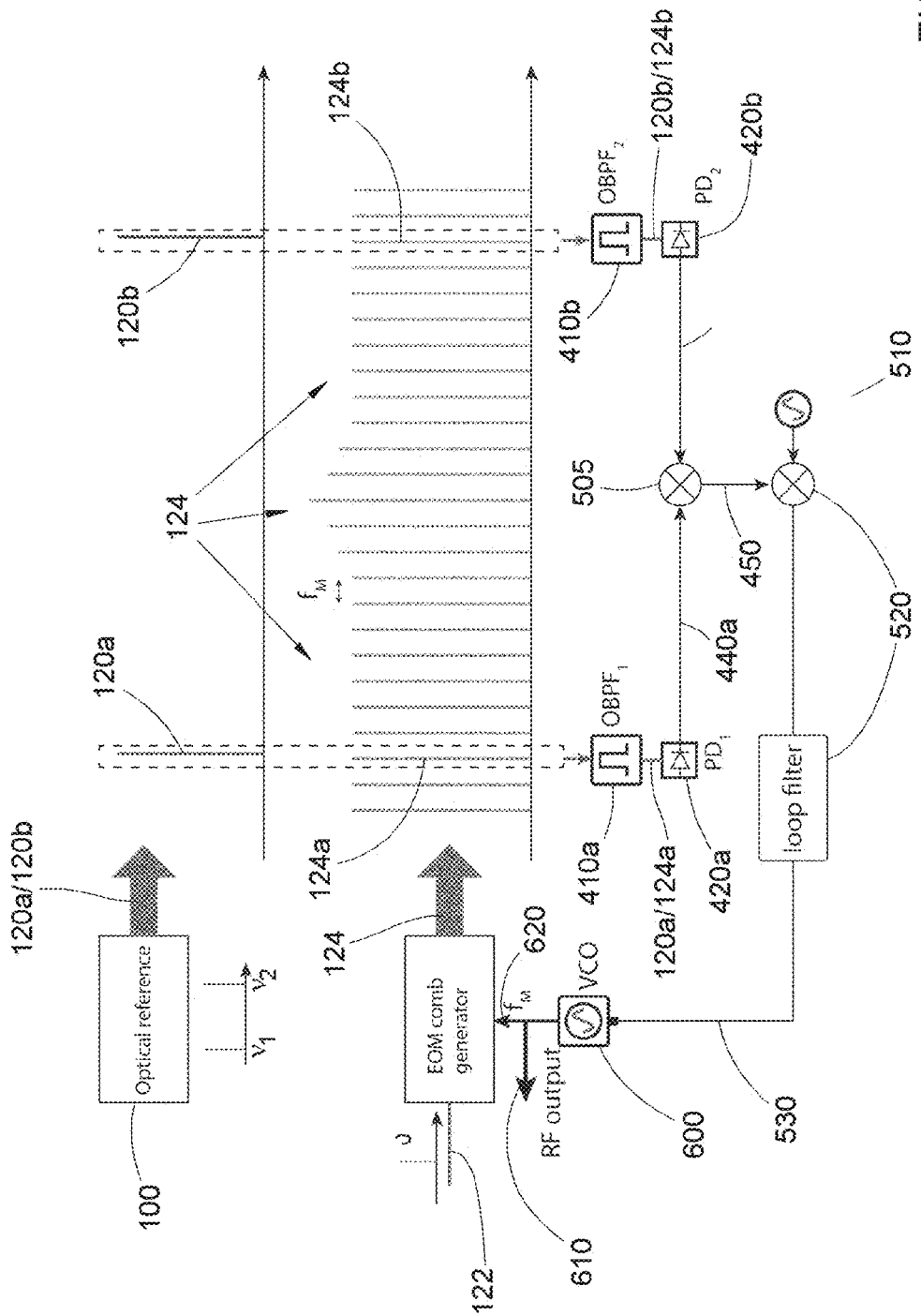
FIG. 1 illustrates schematically an example of optical frequency division according to the present disclosure.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Microwave- and radio-frequency oscillators are widely used in communications, remote sensing, navigation, radar, scientific measurements, computers, clocks, time standards, and in other areas. They provide a single electrical frequency that can often be controllably tuned. Their performance is characterized using various metrics including power output, frequency tuning range, and frequency stability. The last of these metrics, frequency stability, is crucial to most applications, and the cost of an oscillator is directly related to the level of frequency stability that it provides. The very highest performance oscillators have typically been based on electrical oscillators that employ high-Q dielectric resonators to create a highly stable frequency. Optical detection of two highly coherent laser signals is another well-known approach to generate a stable radio-frequency or microwave-frequency signal; two optical signals coincident on an optical detector (i.e., a photodetector) and having an optical frequency difference within the detection frequency bandwidth of the optical detector produce an electrical output signal from the optical detector at the optical difference frequency of the optical signals, also referred to as a beat note or a beat frequency. A newer approach developed over the last few years employs a revolutionary, all-optical approach to microwave synthesis using a device known as a frequency-comb optical divider (or simply "optical divider"). Optical dividers accept as an input a highly coherent optical signal that oscillates at 100 s of THz. This is normally a laser signal that has been stabilized by an optical reference cavity. This very high input frequency is divided down to a rate in the radio-frequency or microwave-frequency range (100 s of MHz or 100 s of GHz) using the optical divider. This division process is accompanied by a dramatic reduction of the phase noise in the final signal relative to the initial optical signal thereby endowing the radio/microwave signal with remarkable (and record) stability. The frequency-comb optical divider employs a special mode locked laser to achieve this reduction.

Disclosed herein are novel, inventive apparatus and methods for achieving optical frequency division and stable operation of a microwave-frequency signal provided by an electrical oscillator having a frequency control input (sometimes called a voltage-controlled oscillator, or VCO). This novel approach is described herein along with preliminary measurements that demonstrate the feasibility of the method. In the inventive approach two optical reference signals, provided by lasers, are frequency-stabilized so that the relative frequency of the lasers (i.e., their optical difference frequency) is as stable as possible (or practicable to achieve performance necessary for a given use or application, i.e., relatively stabilized within an operationally acceptable reference bandwidth). A third optical reference signal is phase modulated using a cascade of phase modulators that are driven by the VCO. In the optical spectrum, this creates a spectrum of sidebands on the optical reference frequency spaced by the modulation frequency. The phase-modulated optical signals can be spectrally broadened to further increase number of sidebands in the side-band frequency spectrum, using an intensity modulator, a dispersion compensator, an optical amplifier (if needed or desired), and a nonlinear optical medium. It is desirable for the frequency separation of the lasers be as large as practicable (for a given use or application) to provide the maximum practicable stabilization of the VCO. However, the frequency separation cannot exceed the range of sidebands generated by the phase modulation cascade (and nonlinear optical broadening, if employed) around the third optical reference frequency.

In some examples, one sideband must be close enough in frequency to the first optical reference signal so that a beat frequency between them can be detected using a first photodiode, while another sideband must be close enough in frequency to the second optical reference signal so that a beat frequency between them can be detected using a second photodiode. As described further below, a difference electrical signal generated by an electrical mixer from the two photodiode signals contains phase information arising from the VCO and is used to stabilize the VCO. The inventive method has already enabled generation of highly stable microwave-frequency signals having a phase noise level well below a high performance electrical oscillator at offset frequencies of 10 kHz and 100 kHz. The performance of the inventive method can be substantially improved by further increasing the frequency separation of the two optical reference signals. In examples disclosed herein these optical reference signals are provided by dual pumping of a single high-Q disk resonator to produce stimulated Brillouin oscillation at two distinct wavelengths. The frequency separation is limited by the ability to pump separate lines efficiently within the same cavity, as is discussed further below. Other dual optical-frequency reference sources can be employed, e.g., a reference source comprising two lasers frequency-locked to separate modes of a single reference resonator cavity.

Compared to a conventional frequency-comb optical divider, the inventive approach does not require a mode-locked frequency comb generator, which is a sophisticated and costly device. Instead, the inventive method employs relatively simpler and less costly optical components, most of which are available commercially. Also, in many examples the reference optical frequency (i.e., the difference frequency of two optical sources) depends on the relative stability of two resonances within a single resonator. This is, in principle, a more robust reference as technical noise in the system (i.e., arising from instabilities in equipment, as opposed to quantum noise inherent in the physics of the system) is common to both resonances and therefore largely cancelled-out in the optical difference frequency. In contrast, the conventional divider approach relies upon an absolute reference frequency, which is more strongly impacted by technical noise. The principle of operation of the inventive optical frequency divider disclosed herein is also different in that the repetition frequency (i.e., sideband spacing) is set by an electrical VCO as opposed to an optical cavity. As a result it is possible to tune the microwave frequency of the output signal, which is not readily achieved with a conventional frequency-comb optical divider. Also, the conventional frequency-comb divider approach relies upon optical detection of a train of high peak power pulses of light with high bandwidth. The linearity of the photodetection process has been shown to be crucial to attaining frequency stability using this approach and greatly restricts the types of optical detectors that may be employed. In contrast the present invention can employ lower-bandwidth optical detectors or detectors with relaxed linearity requirements.

The inventive apparatus and methods disclosed herein for achieving optical frequency division for high-performance microwave-frequency signal generation employ cascaded phase modulation comprising direct phase modulation and also self-phase modulation (if needed or desired to achieve larger division ratios than can be achieve using direct phase modulation alone). In contrast to a comb of spectral lines produced by a mode-locked laser, cascaded phase modulators do not have an intrinsic repetition frequency since there is no optical cavity. While this can endow the cascade-generated comb of sidebands with an arbitrarily chosen line spacing frequency, it also means that optical frequency division must be accomplished in a fashion different from that used with conventional frequency combs.

Figure 2A:
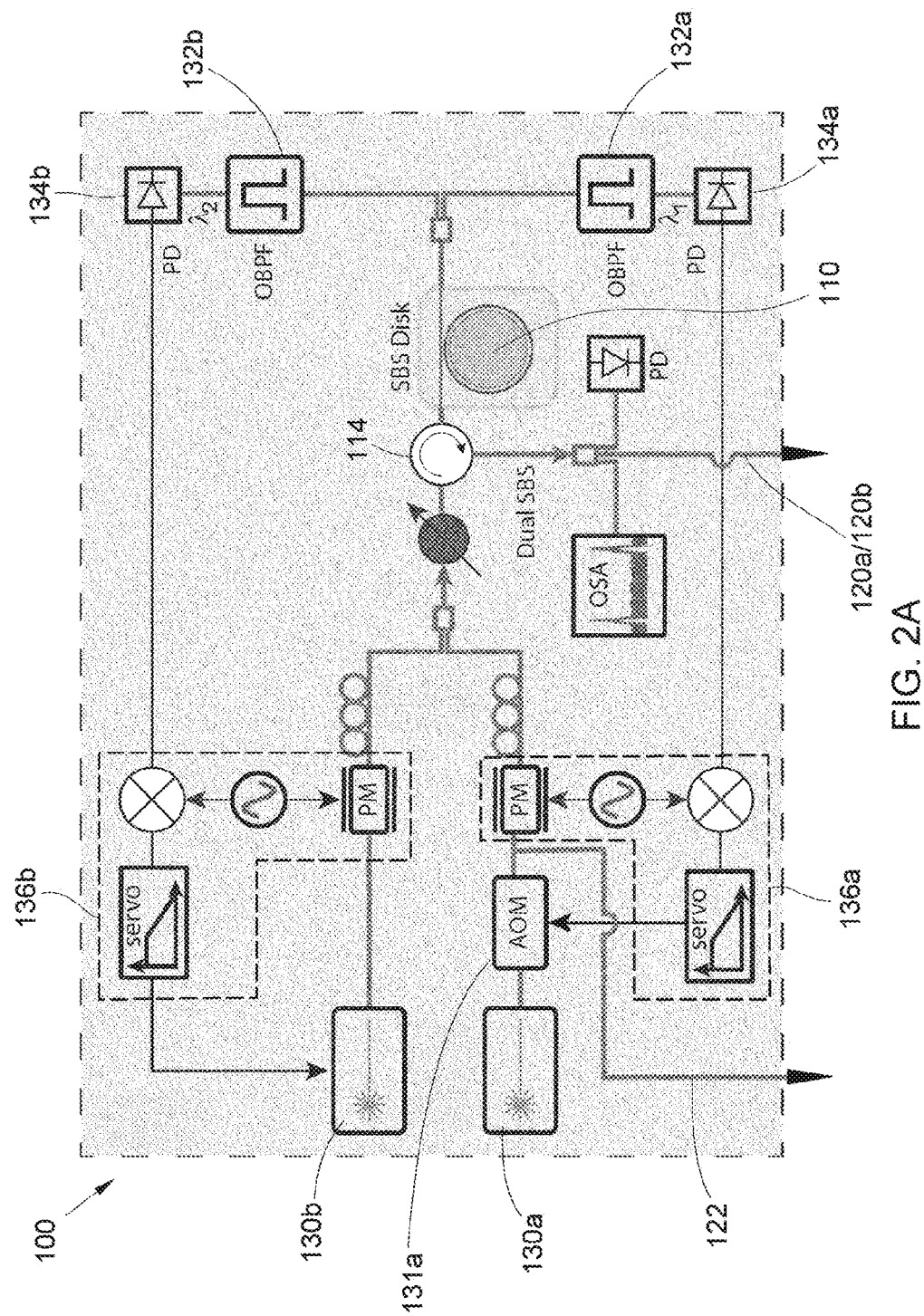
FIG. 2A illustrates schematically an example of a dual-optical-frequency reference source according to the present disclosure.
Figure 2B:
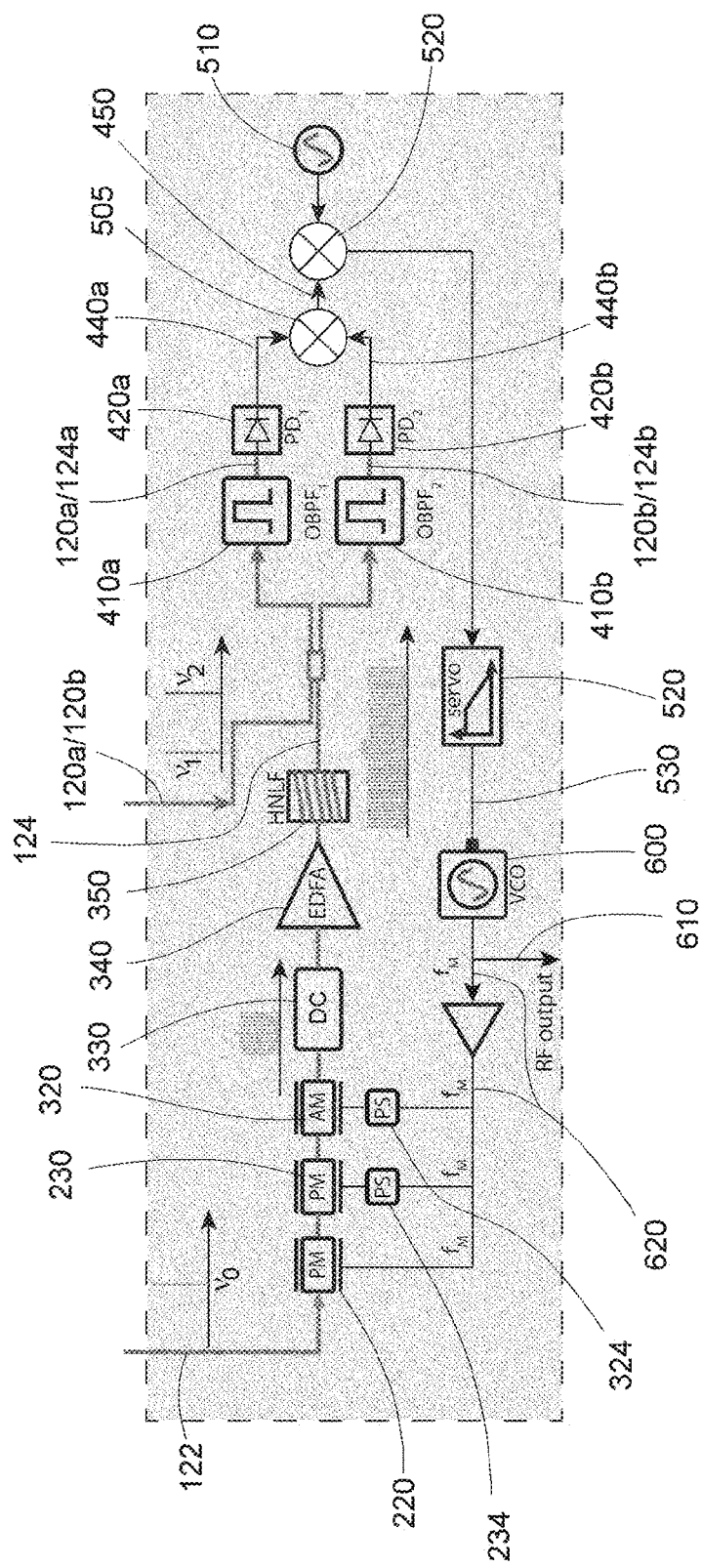
FIG. 2B illustrates schematically an example of an optical frequency divider according to the present disclosure.

FIGS. 1 and 2A/2B illustrate schematically the inventive approach in which two laser lines having sufficiently good (i.e., operationally acceptable) relative frequency stability provide two optical reference signals 120a/120b, at respective optical frequencies $v_1$ and $v_2$, for the microwave-frequency source. FIG. 1 illustrates the optical spectra of the first and second optical reference signals 120a/120b and the sidebands 124 generated from a third optical reference signal 122, and the optical bandpass filters 410a/410b, optical detectors 420a/420b, electrical components 505/510/520, and voltage-controlled oscillator (VCO) 600 employed to produce the microwave-frequency signal. FIG. 2A illustrates an example of a dual optical-frequency reference source 100; FIG. 2B illustrates an example of an optical sideband generator. In some examples (described below), the two laser lines 120a/120b are produced by concomitant Brillouin oscillation in a single high-Q microcavity 110 or fiber-loop cavity (FLC) pumped by two corresponding, independent pump lasers 130a/130b locked to corresponding modes of the microcavity 110. Alternatively, the two laser lines 120a/120b could also be produced by a dual-mode laser, by frequency-locking two lasers to distinct optical modes of a single, common reference cavity. The third optical reference signal 122 (e.g., a third laser line, for example, one of the pump laser lines 130a or 130b) enters an electro-optic sideband generator where it is phase modulated by a pair of modulators 220/230 at a frequency $f_M$ set by a voltage-controlled electrical oscillator 600 (VCO). The sideband spectrum created by the phase modulators 220/230 can be further broadened by pulse-forming and self-phase phase modulation in an optical fiber 350. The multiple sideband optical signals 124 thus formed extend from the third laser line 122 and result in multiple sideband optical signals 124.

The frequency $f_M$ can lie anywhere within the so-called microwave portion of the electromagnetic spectrum, e.g., between about 0.3 GHz and about 300 GHz. In some examples the output frequency $f_M$ is between about 1 GHz and about 100 GHz.

One sideband signal 124a that is spectrally near the first optical reference signal 120a is transmitted along with the signal 120a through the first optical bandpass filter 410a; those transmitted signals are detected by the first photodetector 420a which generates a first optical detector electrical signal 440a at a beat frequency $f_{BEAT1}=|v_1-(v_0-N_1f_M)|$. Another sideband signal 124b that is spectrally near the second optical reference signal 120b is transmitted along with the signal 120b through the second optical bandpass filter 410b; those transmitted signals are detected by the second photodetector 420b which generates a second optical detector electrical signal 440b at a beat frequency $f_{BEAT2}=|v_2-(v_0+N_2f_M)|$. The two optical detector electrical signals 440a/440b are difference-frequency mixed in an electrical mixer 505 to produce a difference electrical signal 450 at frequency $f_{DIFF}=f_{BEAT2}-f_{BEAT1}=|v_2-v_1-(N_1+N_2)\cdot f_M|$. As discussed below, that difference electrical signal 450 contains the phase noise of the VCO 600 magnified by the optical division factor $(N_1+N_2)$, the number of sidebands needed to span the frequencies of the first and second optical reference signals 120a/120b. The difference electrical signal 450 therefore provides a suitable error signal for phase-lock-loop control of the VCO 600. The difference electrical signal 450 is compared to a reference signal produced by a reference oscillator 510. By adjusting the phase of the VCO 600 to nullify the phase difference, $\Delta\phi$, the resulting VCO fluctuations are reduced to the following value: $\phi^2_M \approx (\phi_1-\phi_2)^2/(N_1+N_2)^2$; correlations in the phase noise of the two laser sources (arising, for example, from common-mode technical noise) are cancelled in this approach. The ultimate lower limit of the relative phase noise of the VCO 600 is given by the optical phase noise of the laser lines reduced by the division factor squared (i.e., reduced by a factor of $(N_1+N_2)^2$). Clearly, to reduce phase noise of the electrical VCO 600, the laser frequency separation should be made as large as possible (or practicable for a given use or application, i.e., operationally acceptable). In a preferred embodiment of the inventive system, this magnitude of the optical difference frequency is determined by the span of the dual-pumped Brillouin lasers.

In the example of FIG. 2A, the first and second optical reference laser signals 120a/120b are provided by Brillouin laser lines co-lasing within a single silica-on-silicon high-Q disk resonator 110. The coherence properties of the individual Brillouin laser lines is excellent, and the relative frequency stability of the Brillouin laser lines is enhanced by co-lasing within a common resonator. In the inventive microwave-frequency source the Brillouin laser lines are separated sufficiently that a dual pump configuration is needed. In this example the silica disk resonator 110 is designed and fabricated with a free-spectral-range (FSR) of about 10.890 GHz that substantially matches the Brillouin shift frequency in silica at a pump wavelength of 1550 nm. Other needed, desired, or suitable materials can be employed that exhibit different Brillouin shift frequencies. Each pump laser 130a/130b (emitting at corresponding pump wavelengths $\lambda_1$ and $\lambda_2$) is frequency-locked to a corresponding distinct resonant optical mode of the disk resonator 110 using the Pound-Drever-Hall (PDH) technique, is coupled into the disk resonator 110 through a circulator 114, and excites its own corresponding Brillouin laser in the backward-propagating direction at respective optical reference frequencies $v_1$ and $v_2$. The PDH technique is implemented for each pump laser 130a/130b by employing respective optical bandpass filters 132a/132b, photodetectors 134a/134b, and feedback/servo mechanisms 136a/136b; control of each pump wavelength can be via direct laser control (as with pump laser 130b) or via frequency shifting of the laser output (as with acousto-optic modulator 131a shifting the output of pump laser 130a). The frequency separation (i.e., the optical difference frequency $v_2-v_1$) between the two SBS lasers can be readily tuned by tuning the pump lasers 130a/130b to pump at resonator modes with different azimuthal mode orders. Instead of a disk resonator, a fiber-loop optical resonator (i.e., a fiber-loop cavity or FLC) can be employed. The first and second optical reference signals 120a/120b are coupled to the optical divider section using the circulator 114; other suitable arrangements can be employed, e.g., a beamsplitter or a fiber coupler.

To generate multiple sideband optical signals 124 in the example of FIG. 2B, two cascaded phase modulators 220/230 are employed that have relatively low $V_\pi$ (e.g., ~3.9V at 12 GHz) and are phase synchronized with an RF phase shifter 234. The drive signal to the phase modulators 220/230 (i.e., the sideband generator input electrical signal) is a portion 620 of the output electrical signal of the VCO 600 at a frequency $f_M$. In one example, up to about 30 electro-optic-modulated (EOM) sidebands (i.e., $N_1+N_2$ up to about 30) can be generated using only a first portion 200 of the sideband generator (i.e., using only phase modulators 220/230 for generating the sideband signals 124), resulting in an optical difference frequency $v_2-v_1$ of up to about 327 GHz and optical division by a factor of up to about 30. With frequency division by 30, the phase noise of the microwave-frequency signal 610 will be reduced by about a factor of about 900, relative to phase noise of the optical difference frequency of the optical reference signals 120a/120b, by feedback stabilization of the frequency $f_M$ (described further below). Two phase modulators are employed in the example shown in FIG. 2B; however, a single phase modulator can be employed if it provides sufficiently large modulation to produce sufficiently many sidebands.

To further enhance the sideband spectral width, additional phase modulators can be used, or phase modulators providing larger phase modulation amplitude can be used. Alternatively, or in addition, so-called continuum generation (e.g., as described in the publications of Huang et al (2008), Morohashi et al (2009), Ishizawa et al (2013), and Suzuki et al (2013), incorporated above) can be employed (as in FIG. 2B). An intensity modulator 320 is employed that is driven at frequency $f_M$ by a portion of the VCO signal 620 and synchronized using a phase shifter 324; a dispersion compensator 330, an optical amplifier 340, and a nonlinear optical medium 350 are also employed. In a typical example, the intensity modulator 320 can comprise an electro-optic Mach-Zehnder interferometer, the dispersion compensator 330 (DC) can comprise a suitable length of suitably dispersive optical fiber (e.g., dispersion-shifted optical fiber or an optical fiber including a dispersion-shifting grating), the optical amplifier 340 can comprise an erbium-doped optical fiber amplifier (EDFA), and the nonlinear optical medium 350 can comprise a suitable length of highly nonlinear optical fiber (HNLF). Other functionally equivalent components can be employed, e.g., an electroabsorption modulator. In this example, continuum generation, cascaded with the phase modulators 220/230, can generate sufficiently many sidebands to enable the two optical reference signals 120a/120b to be spaced farther apart spectrally than is typically possible using phase modulators alone; in this example, an optical difference frequency $v_2-v_1$ can be generated up to 148 FSR or more of the disk resonator 110 (i.e., up to about 1.6 THz apart or more in this example; $N_1+N_2$ up to 148 or more; typically limited by the gain bandwidth of the EDFA). With frequency division by 148, the phase noise of the microwave-frequency signal 610 will be reduced by about a factor of over 20,000 relative to phase noise of the optical reference signals 120a/120b by feedback stabilization of the frequency $f_M$ (described further below). Even greater reduction of phase noise can be achieved by using even larger optical difference frequencies.

The first optical bandpass filter 410a is arranged so as to transmit the first optical reference signal 120a and a subset of the multiple sideband optical signals including the sideband optical signal 124a at a frequency $v_0-N_1 f_M$ ($N_1$ is an integer). The signals 120a/124a transmitted by the first optical bandpass filter 410a are received by the first optical detector 420a, which generates therefrom (via linear superposition on the detector) a first optical detector electrical signal 440a at a first beat frequency $f_{BEAT1}=|v_1-(v_0-N_1 f_M)|$. The second optical bandpass filter 410b is arranged so as to transmit the second optical reference signal 120b and a subset of the multiple sideband optical signals including the sideband optical signal 124b at a frequency $v_0+N_2 f_M$ ($N_2$ is an integer). The signals 120b/124b transmitted by the first optical bandpass filter 410b are received by the second optical detector 420b, which generates therefrom (via linear superposition on the detector) a second optical detector electrical signal 440b at a second beat frequency $f_{BEAT2}=|v_2-(v_0+N_2 f_M)|$. The optical detector electrical signals 440a/440b are mixed by an electrical mixer 505 to generate a difference electrical signal 450 at an electrical difference frequency $f_{DIFF}=f_{BEAT2}-f_{BEAT1}=|v_2-v_1-(N_1+N_2)\cdot f_M|$. The frequency of the difference electrical signal 450 does not depend on the optical frequency $v_0$ of the third optical reference signal 122, nor does the phase noise of the difference electrical signal 450 depend on the phase noise of the optical signal 122.

A reference oscillator 510 generates a reference oscillator electrical signal at frequency $f_R$ (a quartz oscillator operating at about 10 MHz in this example; any suitable reference oscillator can be employed; frequencies $f_R$ from about 1 MHz to about 1 GHz, i.e., $<<f_M$, have been employed). The phase noise contributed by the reference oscillator 510 typically is negligible relative to the phase noise of the optical reference signals 120a/120b, and therefore typically does not present any limit on the phase noise reduction achievable by the optical frequency division process. A comparator portion of an electrical circuit 520 compares the phases of the difference electrical signal 450 and the reference electrical signal and generates an error signal (in any needed, desired, or suitable way), which is then loop-filtered by the circuit 520 (in any needed, desired, or suitable way). The loop-filtered error signal serves as a VCO electrical input signal 530 used for phase-locking the VCO 600 to a subharmonic (i.e., integer submultiple) of the frequency $v_2-v_1$. In the example the VCO 600 comprises a microwave generator operated using the external FM modulation input mode; any suitable type or implementation of a VCO 600 can be employed. Reception of the first portion 620 of the VCO output electrical signal by the electro-optic sideband generator as the sideband generator input electrical signal results in the electrical circuit 520 and the voltage-controlled oscillator 600 being coupled in a negative feedback arrangement so as to function as a phase-locked loop (PLL). Comparator and loop-filter portions of the electrical circuit 520 can be implemented in any needed, desired, or suitable way.

In one experimental implementation, a silica microdisk 110 is designed and fabricated so as to exhibit a free spectral range (FSR) about equal to the Brillouin shift frequency in silica (about 10.89 GHz for pumping near 1550 nm). The two pump lasers 130a/130b are locked to two optical modes of the disk resonator 110 of the same transverse cavity mode family but with different azimuthal mode numbers. The laser 130a operates at $\lambda_1$ of about 1550.0 nm and the laser 130b operates at $\lambda_2$ of about 1537.2 nm. Brillouin laser output of the microdisk 110 pumped by the lasers 130a/130b produces the first and second optical references signals 120a/120b; the resulting optical reference frequency difference $v_2-v_1$ is about 1.61 THz (148 FSRs apart in the microdisk 110). In this example the output of the first laser 130a at about 1550.0 nm serves as the third optical reference signal 122. The multiple sideband optical signals 124 in this example span about 50 nm (near 1550 nm), and so are amply sufficient to span the optical frequency difference $v_2-v_1$ (about 12.8 nm in this example). The frequency $f_M$ is set to be about equal to the FSR of the microdisk cavity 110. In that way, the optical frequencies $v_1$ and $v_2$ will each lie sufficiently close to a corresponding one of the sidebands to generate a correspondingly low beat frequency, e.g., within the detection bandwidth of the photodetectors 420a/420b.

Figure 3:
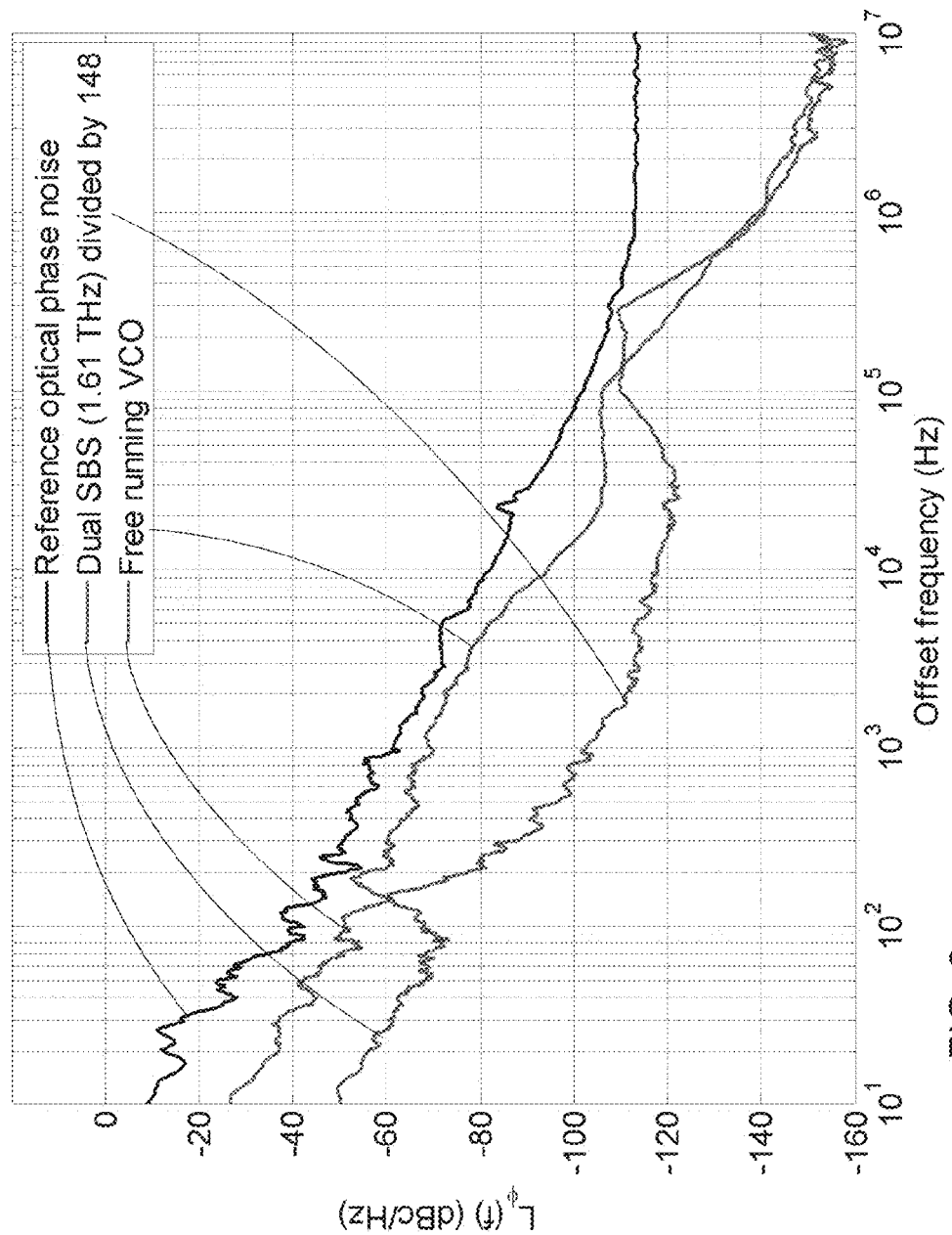
FIG. 3 is a plot illustrating reduction of phase noise resulting from use of the disclosed optical frequency divider.

Results from the experimental implementation are shown on FIG. 3. The upper curve represents the phase noise of the optical difference signal at frequency $v_2-v_1$. with the lasers locked to resonances of the microdisk 110 but without operation of the optical frequency divider or phase-locked loop circuitry. That phase noise is substantially independent of the frequency separation. The middle curve represents the noise of the microwave-frequency output of the free-running VCO 600, and the lower curve represents the phase noise of the microwave-frequency output of the VCO 600 with the optical frequency divider operating and providing the loop-filtered error signal as an input to the VCO 600. The phase noise is reduced by about 40 dB or more over a range of 10 Hz to 10 kHz, compared to the predicted noise reduction of about 42 dB (arising from a division factor of $N_1+N_2=148$; $1/148^2$ is equivalent to a reduction of about 42 dB). The bandwidth of the phase-licked loop in this example is about 300 kHz, resulting in the peak in the lower curve at about 300 kHz in FIG. 3. When dividing the 1.61 THz Brillouin optical difference frequency by a factor of 148, the achieved phase noise level for the 10.89 GHz carrier is about −103 dBc/Hz at 1 kHz offset frequency and about −118 dBc/Hz at 10 kHz offset frequency.

It is advantageous to increase the division ratio to reduce phase noise of the generated microwave-frequency electrical signal. One way to achieve a higher division ratio is to increase the reference optical difference frequency $v_2-v_1$. In some examples, the reference optical difference frequency $v_2-v_1$ is greater than about 100 GHz. In some of those examples, the reference optical difference frequency $v_2-v_1$ is greater than about 300 GHz, greater than about 1 THz, greater than 10 THz, or greater than 100 THz. Still larger reference optical difference frequencies can be employed as needed, desired, or suitable, or as suitable optical sources are developed or become available.

Depending on the reference optical difference frequency $v_2-v_1$ and the desired output frequency $f_M$, any suitable division ratio $N_1+N_2$ can be employed. In some examples the division ratio $N_1+N_2$ is greater than or equal to 10, greater than or equal to 50, greater than or equal to 100, or greater than or equal to 1000. As noted above, a greater division ratio provides greater reduction of phase noise.

The optical reference signals 120a/120b can be provided at any needed, desired, or suitable optical frequencies. In some examples the, first and second optical reference frequencies $v_1$ and $v_2$ are each between about 75 THz and about 750 THz (i.e., wavelengths between about 400 nm and about 4 μm), between about 120 THz and about 430 THz (i.e., wavelengths between about 700 nm and about 2.5 μm), or between about 150 THz and about 300 THz (i.e., between about 1 μm and about 2 μm). The latter two ranges can be convenient due to ready availability of fiber-optic and/or solid state sources in those wavelength regions. Other wavelengths can be employed.

In some examples, the reference oscillator frequency can be between about 1 MHz and about 1 GHz, between about 5 MHz and about 100 MHz, or between about 10 MHz and about 50 MHz. In some examples, the reference oscillator 510 comprises a crystal oscillator, e.g., a quartz oscillator. In some other examples, the reference oscillator 510 comprises an electrical oscillator, e.g., a frequency-synthesized oscillator. Any suitably stable reference oscillator can be employed that provides sufficiently stable (i.e., operationally acceptable) performance of the microwave-frequency source in a given use or application.

In some examples, the dual optical-frequency reference source 100 is stabilized so as to maintain fluctuations of a reference optical difference frequency $v_2-v_1$ (i.e., relative frequency stability of the lasers) within an operationally acceptable optical reference bandwidth. In some examples, the operationally acceptable reference bandwidth (given as a bandwidth characterized over a given time interval) is less than about 100 Hz over about a 1 second timescale, or less than about 1 Hz over about a 1 second timescale. In some examples, the operationally acceptable reference bandwidth (given as optical phase noise at a given offset frequency relative to the optical carrier frequency) is about −40 dBc/Hz at 100 Hz offset frequency and about −80 dBc/Hz at 10 kHz offset frequency, or about −80 dBc/Hz at 100 Hz offset frequency and about −125 dBc/Hz at 10 kHz offset frequency. Generally, improved levels of relative stability of the laser sources will translate directly into improvements in the overall frequency stability of the microwave-frequency output signal. Still better stabilized references can be employed as needed, desired, or suitable, or as suitable optical sources are developed or become available.

As noted above, in some examples the dual optical-frequency reference source 100 comprises first and second pump laser sources 130a/130b and an optical resonator (e.g., a disk resonator 110 as in FIG. 2A, a fiber-loop or Fabry-Perot fiber resonator, or other suitable ring or linear resonator). The free spectral range (FSR) of the optical resonator 110 is substantially equal to a Brillouin shift frequency of the optical resonator (or an integer submultiple thereof). In some examples, the optical resonator comprises silica and the Brillouin shift frequency of the optical resonator is about 10.9 GHz; other needed, desired, or suitable materials can be employed that exhibit different Brillouin shift frequencies. Each one of the first and second pump laser sources 120a/120b is frequency-locked to a corresponding resonant optical mode of the optical resonator 110. The first and second optical reference signals 120a/120b comprise stimulated Brillouin laser (SBL) output generated by optical pumping of the optical resonator simultaneously by the first and second pump laser sources 130a/130b, respectively. In some examples, the free spectral range of the optical resonator 110 is substantially equal to the Brillouin shift frequency of the optical resonator. In some examples, the optical resonator comprises a ring optical resonator such as a disk optical resonator 110 (as in FIG. 2A). In other examples, the optical resonator comprises a fiber optical resonator, such as a fiber-loop optical resonator or a linear, Fabry-Perot-type fiber optical resonator (which can include, e.g., fiber Bragg gratings at the pump frequency or the SBL frequency). In some examples, each one of the first and second pump laser sources is frequency-locked to the corresponding resonant optical mode of the resonator 110 by a Pound-Drever-Hall mechanism; any suitable mechanism can be employed, e.g., a Hansch-Couillaud mechanism.

In some examples, including those described above, the third optical reference frequency $v_0$ lies between the first and second optical reference frequencies $v_1$ and $v_2$ (i.e., $v_1 < v_0 < v_2$), however, this need not be the case. In other examples the third optical reference frequency $v_0$ can be less than the first optical reference frequency $v_1$ (i.e., $v_0 < v_1 < v_2$); in still other examples the third optical reference frequency $v_0$ can be greater than the second optical reference frequency $v_2$ (i.e., $v_1 < v_2 < v_0$). In any of those cases, the multiple sideband optical signals 124 must include frequencies that span the range from $v_1$ to $v_2$. To ensure that both first and second optical reference frequencies are sufficiently close to corresponding sideband frequencies, the third optical reference signal 122 can be coupled to the same resonator cavity 110 as the first and second optical reference signals 120a/120b. In the examples described, a portion of the output of one of the pump lasers 130a/130b can be employed as the third optical reference signal 122 along with Brillouin laser output signals 120a/120b. In other examples, a third laser can be locked to a resonance of the resonator 110, and output of that third laser, or Brillouin laser output from resonator 110 pumped by the third laser, can be employed as the third optical reference signal 122. In yet another example, three lasers can each be locked to different resonances of a common optical reference cavity. The frequency $f_M$ in such examples should be an integer submultiple of the FSR of the reference cavity. Any other suitable stabilized optical-frequency reference source, including those described in U.S. Pat. Pub. Nos. 2015/0236784 and 2015/0236789, can be employed that provides needed, desired, or suitable (i.e., operationally acceptable) reference frequencies and optical difference frequency stability of the first, second, and third optical reference signals 120a, 120b, and 122.

In the examples described thus far, the third optical reference frequency $v_0$ differs from both the first and second optical reference frequencies $v_1$ and $v_2$. In other examples, a portion of the first optical reference signal can serve as the third optical reference signal so that $v_0 = v_1$. In such examples the electro-optic sideband generator generates the multiple sideband optical signals at respective sideband optical frequencies of the form $v_1 \pm nf_M$ (n is an integer). The second optical bandpass filter 410b transmits the second optical reference signal 120b and the sideband optical signal 124b at a frequency $v_1 + N_2 f_M$. The second optical detector 420b generates the second optical detector electrical signal 440b at the second beat frequency $f_{BEAT2} = |v_2 - (v_1 + N_2 f_M)|$. The electrical difference frequency mixer 505 is not needed; the electrical circuit 520 generates the error signal from the reference oscillator electrical signal and the second optical detector electrical signal 440b. Phase noise of the output electrical signal of the microwave-frequency source at the frequency $f_M$ is reduced by a factor of about $(N_2)^2$ relative to phase noise of the reference difference frequency signal at the reference optical difference frequency $v_2 - v_1$ of the dual optical-frequency reference source 100.

In still other examples, a portion of the second optical reference signal can serve as the third optical reference signal so that $v_0 = v_2$. In such examples the electro-optic sideband generator generates the multiple sideband optical signals at respective sideband optical frequencies of the form $v_2 \pm nf_M$ (n is an integer). The first optical bandpass filter 410a transmits the first optical reference signal 120a and the sideband optical signal 124a at a frequency $v_2 - N_1 f_M$. The first optical detector 420a generates the first optical detector electrical signal 440a at the first beat frequency $f_{BEAT1} = |v_1 - (v_2 - N_1 f_M)|$. The electrical difference frequency mixer 505 is not needed; the electrical circuit 520 generates the error signal from the reference oscillator electrical signal and the first optical detector electrical signal 440a. Phase noise of the output electrical signal of the microwave-frequency source at the frequency $f_M$ is reduced by a factor of about $(N_1)^2$ relative to phase noise of the reference difference frequency signal at the reference optical difference frequency $v_2 - v_1$ of the dual optical-frequency reference source 100.

In addition to the preceding, the following examples fall within the scope of the present disclosure or appended claims:

Example 1

A microwave-frequency source for generating an output electrical signal at an output frequency $f_M$, the microwave-frequency source comprising: (a) a dual optical-frequency reference source arranged so as to generate (i) a first optical reference signal at a first optical reference frequency $v_1$ and (ii) a second optical reference signal at a second optical reference frequency $v_2 > v_1$; (b) an electro-optic sideband generator arranged so as to (i) receive a third optical reference signal at a third optical reference frequency $v_0$ and a sideband generator input electrical signal at the frequency $f_M$ and (ii) generate therefrom multiple sideband optical signals at respective sideband optical frequencies of the form $v_0 \pm nf_M$, wherein n is an integer; (c) one or both of (i) a first optical bandpass filter arranged so as to transmit the first optical reference signal and a subset of the multiple sideband optical signals including the sideband optical signal at a frequency $v_0 - N_1 f_M$, wherein $N_1$ is an integer, or (ii) a second optical bandpass filter arranged so as to transmit the second optical reference signal and a subset of the multiple sideband optical signals including the sideband optical signal at a frequency $v_0 + N_2 f_M$, wherein $N_2$ is an integer; (d) one or both of (i) a first optical detector arranged so as to receive the optical signals transmitted by the first optical bandpass filter and to generate therefrom a first optical detector electrical signal at a first beat frequency $f_{BEAT1} = |v - (v_0 - N_1 f_M)|$, or (ii) a second optical detector arranged so as to receive the optical signals transmitted by the second optical bandpass filter and to generate therefrom a second optical detector electrical signal at a second beat frequency $f_{BEAT2} = |v_2 - (v_0 + N_2 f_M)|$; (e) a reference oscillator arranged so as to generate a reference oscillator electrical signal at a reference oscillator frequency $f_R$; (f) an electrical circuit arranged so as to (i) receive the reference oscillator electrical signal and only one of (A) the first optical detector electrical signal, (B) the second optical detector electrical signal, or (C) a difference electrical signal generated from the first and second optical detector electrical signals by an electrical frequency mixer at an electrical difference frequency $f_{DIFF} = f_{BEAT2} - f_{BEAT1} = |v_2 - v_1 - (N_1 + N_2) \cdot f_M|$, (ii) generate therefrom, using a comparator portion of the electrical circuit, an electrical error signal dependent on relative phase of the electrical signals received by the electrical circuit, and (iii) process the electrical error signal using a loop-filter portion of the electrical circuit; and (g) a voltage-controlled electrical oscillator arranged so as to (i) receive the loop-filtered electrical error signal as a VCO input electrical signal and (ii) generate a VCO output electrical signal at the frequency $f_M$, wherein a first portion of the VCO output electrical signal is received by the electro-optic sideband generator as the sideband generator input electrical signal and a second portion of the VCO output electrical signal forms the output electrical signal of the microwave-frequency source, (h) wherein reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

Example 2

The microwave-frequency source of Example 1 wherein: (b') the third optical reference frequency $v_0$ differs from the first optical reference frequency $v_1$ and from the second optical reference frequency $v_2$; (c') the first optical bandpass filter is arranged so as to transmit the first optical reference signal and a subset of the multiple sideband optical signals including the sideband optical signal at the frequency $v_0 - N_1 f_M$, and the second optical bandpass filter is arranged so as to transmit the second optical reference signal and a subset of the multiple sideband optical signals including the sideband optical signal at the frequency $v_0 + N_2 f_M$; (d') the first optical detector is arranged so as to receive the optical signals transmitted by the first optical bandpass filter and to generate therefrom the first optical detector electrical signal at the first beat frequency $f_{BEAT1} = |v_1 - (v_0 - N_1 f_M)|$, and the second optical detector arranged so as to receive the optical signals transmitted by the second optical bandpass sideband optical signals and to generate therefrom the second optical detector electrical signal at the second beat frequency $f_{BEAT2} = |v_2 - (v_0 + N_2 f_M)|$; and (f') the electrical circuit is arranged so as to (i) receive the reference oscillator electrical signal and the difference electrical signal at the electrical difference frequency $f_{DIFF} = f_{BEAT2} - f_{BEAT1} = |v_2 - v_1 - (N_1 + N_2) \cdot f_M|$, and (ii) generate therefrom, using the comparator portion of the electrical circuit, the electrical error signal dependent on the relative phase of the reference oscillator electrical signal and the difference electrical signal received by the electrical circuit, and (iii) process the electrical error signal using the loop-filter portion of the electrical circuit.

Example 3

The microwave-frequency source of Example 2 wherein phase noise of the output electrical signal of the microwave-frequency source is reduced by a factor of about $(N_1 + N_2)^2$ relative to phase noise of a reference difference frequency signal at a reference optical difference frequency $v_2 - v_1$ of the dual optical-frequency reference source.

Example 4

The microwave-frequency source of Example 1 wherein: (b') the electro-optic sideband generator is arranged so as to (i) receive a portion of the first optical reference signal as the third optical reference signal so that $v_0 = v_1$ and (ii) generate therefrom multiple sideband optical signals at respective sideband optical frequencies of the form $v_1 \pm nf_M$, wherein n is an integer; (c') the second optical bandpass filter is arranged so as to transmit the second optical reference signal and a subset of the multiple sideband optical signals including the sideband optical signal at a frequency $v_1 + N_2 f_M$; (d') the second optical detector is arranged so as to receive the optical signals transmitted by the second optical bandpass filter and to generate therefrom the second optical detector electrical signal at the second beat frequency $f_{BEAT2} = |v_2 - (v_1 + N_2 f_M)|$; and (f') the electrical circuit is arranged so as to (i) receive the reference oscillator electrical signal and the second optical detector electrical signal, and (ii) generate therefrom, using the comparator portion of the electrical circuit, the electrical error signal dependent on the relative phase of the reference oscillator electrical signal and the second optical detector electrical signal received by the electrical circuit, and (iii) process the electrical error signal using the loop-filter portion of the electrical circuit.

Example 5

The microwave-frequency source of Example 4 wherein phase noise of the output electrical signal of the microwave-frequency source is reduced by a factor of about $(N_2)^2$ relative to phase noise of a reference difference frequency signal at a reference optical difference frequency $v_2 - v_1$ of the dual optical-frequency reference source.

Example 6

The microwave-frequency source of Example 1 wherein: (b') the electro-optic sideband generator is arranged so as to (i) receive a portion of the second optical reference signal as the third optical reference signal so that $v_0 = v_2$ and (ii) generate therefrom multiple sideband optical signals at respective sideband optical frequencies of the form $v_2 \pm nf_M$, wherein n is an integer; (c') the first optical bandpass filter is arranged so as to transmit the first optical reference signal and a subset of the multiple sideband optical signals including the sideband optical signal at a frequency $v_2-N_1f_M$; (d') the first optical detector is arranged so as to receive the optical signals transmitted by the first optical bandpass filter and to generate therefrom the first optical detector electrical signal at the first beat frequency $f_{BEAT1}=|v_1-(v_2-N_1f_M)|$; and (f') the electrical circuit is arranged so as to (i) receive the reference oscillator electrical signal and the first optical detector electrical signal, and (ii) generate therefrom, using the comparator portion of the electrical circuit, the electrical error signal dependent on the relative phase of the reference oscillator electrical signal and the first optical detector electrical signal received by the electrical circuit, and (iii) process the electrical error signal using the loop-filter portion of the electrical circuit.

Example 7

The microwave-frequency source of Example 6 wherein phase noise of the output electrical signal of the microwave-frequency source is reduced by a factor of about $(N_1)^2$ relative to phase noise of a reference difference frequency signal at a reference optical difference frequency $v_2-v_1$ of the dual optical-frequency reference source.

Example 8

The microwave-frequency source of any one of Examples 1 through 7 wherein the output frequency $f_M$ is between about 0.3 GHz and about 300 GHz.

Example 9

The microwave-frequency source of any one of Examples 1 through 7 wherein the output frequency $f_M$ is between about 1 GHz and about 100 GHz.

Example 10

The microwave-frequency source of any one of Examples 1 through 9 wherein the reference oscillator frequency is between about 1 MHz and about 1 GHz.

Example 11

The microwave-frequency source of any one of Examples 1 through 9 wherein the reference oscillator frequency is between about 10 MHz and about 100 MHz.

Example 12

The microwave-frequency source of any one of Examples 1 through 11 wherein the reference oscillator comprises a crystal oscillator.

Example 13

The microwave-frequency source of any one of Examples 1 through 11 wherein the reference oscillator comprises an electrical oscillator.

Example 14

The microwave-frequency source of any one of Examples 1 through 13 wherein a reference optical difference frequency $v_2-v_1$ is greater than about 100 GHz.

Example 15

The microwave-frequency source of Example 14 wherein a reference optical difference frequency $v_2-v_1$ is greater than about 1 THz.

Example 16

The microwave-frequency source of Example 14 wherein a reference optical difference frequency $v_2-v_1$ is greater than about 10 THz.

Example 17

The microwave-frequency source of Example 14 wherein a reference optical difference frequency $v_2-v_1$ is greater than about 100 THz.

Example 18

The microwave-frequency source of any one of Examples 1 through 17 wherein $N_1+N_2$ is greater than or equal to 10.

Example 19

The microwave-frequency source of Example 18 wherein $N_1+N_2$ is greater than or equal to 50.

Example 20

The microwave-frequency source of Example 18 wherein $N_1+N_2$ is greater than or equal to 100.

Example 21

The microwave-frequency source of Example 18 wherein $N_1+N_2$ is greater than or equal to 1000.

Example 22

The microwave-frequency source of any one of Examples 1 through 21 wherein the first and second optical reference frequencies $v_1$ and $v_2$ are each between about 75 THz and about 750 THz.

Example 23

The microwave-frequency source of Example 22 wherein the first and second optical reference frequencies $v_1$ and $v_2$ are each between about 120 THz and about 430 THz.

Example 24

The microwave-frequency source of Example 22 wherein the first and second optical reference frequencies $v_1$ and $v_2$ are each between about 150 THz and about 300 THz.

Example 25

The microwave-frequency source of any one of Examples 1 through 24 wherein the dual optical-frequency reference source is stabilized so as to (i) maintain fluctuations of a reference optical difference frequency $v_2-v_1$ within an operationally acceptable optical reference bandwidth or (ii) maintain phase noise of a reference optical difference frequency signal within an operationally acceptable reference phase noise level.

Example 26

The microwave-frequency source of Example 25 wherein the operationally acceptable reference bandwidth is less than about 100 Hz over about a 1 second timescale.

Example 27

The microwave-frequency source of Example 25 wherein the operationally acceptable reference bandwidth is less than about 1 Hz over about a 1 second timescale.

Example 28

The microwave-frequency source of any one of Examples 25 through 27 wherein the operationally acceptable reference phase noise level is about −40 dBc/Hz at 100 Hz offset frequency and about −80 dBc/Hz at 10 kHz offset frequency.

Example 29

The microwave-frequency source of any one of Examples 25 through 27 wherein the operationally acceptable reference phase noise level is about −80 dBc/Hz at 100 Hz offset frequency and about −125 dBc/Hz at 10 kHz offset frequency.

Example 30

The microwave-frequency source of any one of Examples 1 through 29 wherein (i) the dual optical-frequency reference source comprises first and second pump laser sources and an optical resonator, (ii) a free spectral range of the optical resonator is substantially equal to a Brillouin shift frequency of the optical resonator or an integer submultiple thereof, (iii) each one of the first and second pump laser sources is frequency-locked to a corresponding resonant optical mode of the optical resonator, and (iv) the first and second optical reference signals comprise stimulated Brillouin laser output generated by optical pumping of the optical resonator simultaneously by the first and second pump laser sources, respectively.

Example 31

The microwave-frequency source of Example 30 wherein the third optical reference signal is comprises a portion of the optical output of one of the first or second pump laser sources.

Example 32

The microwave-frequency source of any one of Examples 30 or 31 wherein the frequency $f_M$ is about equal to the free spectral range of the optical resonator or an integer submultiple thereof.

Example 33

The microwave-frequency source of any one of Examples 30 through 32 wherein the free spectral range of the optical resonator is substantially equal to the Brillouin shift frequency of the optical resonator.

Example 34

The microwave-frequency source of any one of Examples 30 through 33 wherein the optical resonator comprises silica and the Brillouin shift frequency of the optical resonator is about 10.9 GHz.

Example 35

The microwave-frequency source of any one of Examples 30 through 34 wherein the optical resonator comprises a ring optical resonator.

Example 36

The microwave-frequency source of Example 35 wherein the ring optical resonator comprises a disk optical resonator.

Example 37

The microwave-frequency source of any one of Examples 30 through 34 wherein the optical resonator comprises a fiber optical resonator.

Example 38

The microwave-frequency source of Example 37 wherein the optical resonator comprises a fiber Fabry-Perot optical resonator.

Example 39

The microwave-frequency source of Example 37 wherein the fiber optical resonator comprises a fiber-loop optical resonator.

Example 40

The microwave-frequency source of any one of Examples 30 through 39 wherein each one of the first and second pump laser sources is frequency-locked to the corresponding resonant optical mode of the optical resonator by a Pound-Drever-Hall mechanism.

Example 41

The microwave-frequency source of any one of Examples 1 through 29 wherein the dual optical-frequency reference source comprises a dual-mode laser source.

Example 42

The microwave-frequency source of Example 41 wherein the dual optical-frequency reference source comprises first and second reference laser sources, wherein the first and second laser sources are each frequency-locked to a corresponding distinct resonant optical mode of a common optical reference cavity.

Example 43

The microwave-frequency source of Example 42 wherein the third optical reference signal is provided by a third laser source, and the third laser source is frequency-locked to a corresponding resonant optical mode, distinct from the optical modes to which are frequency-locked the first and second laser sources, of the common optical reference cavity.

Example 44

The microwave-frequency source of any one of Examples 42 or 43 wherein the frequency $f_M$ is about equal to a free spectral range of the common optical reference cavity or an integer submultiple thereof.

Example 45

The microwave-frequency source of any one of Examples 1 through 44 wherein (i) the electro-optic sideband generator comprises one or more electro-optic phase modulators each driven by a corresponding portion of the sideband generator input electrical signal at the frequency $f_M$, and (ii) the one or more phase modulators are arranged so as to transmit the third optical reference signal so as to generate the multiple optical sideband signals.

Example 46

The microwave-frequency source of any one of Examples 1 through 45 wherein (i) the electro-optic sideband generator comprises two or more electro-optic phase modulators each driven by a corresponding portion of the sideband generator input electrical signal at the frequency $f_M$, and (ii) the two or more phase modulators are arranged in series so as to sequentially transmit the third optical reference signal so as to generate the multiple optical sideband signals.

Example 47

The microwave-frequency source of Example 46 wherein pairs of sideband optical signals are generated with n ranging from 2 up to at least 30.

Example 48

The microwave-frequency source of Example 46 wherein pairs of sideband optical signals are generated with n ranging from 2 up to at least 100.

Example 49

The microwave-frequency source of any one of Examples 45 through 48 wherein (i) the electro-optic sideband generator further comprises one or more electro-optic phase modulators each driven by a corresponding portion of the sideband generator input electrical signal at the frequency $f_M$, an intensity modulator driven by a corresponding portion of the sideband generator input electrical signal at the frequency $f_M$, a dispersion compensator, an optical amplifier, and a nonlinear optical medium, and (ii) the one or more phase modulators, the intensity modulator, the dispersion compensator, the optical amplifier, and the nonlinear optical medium are arranged in series so as to sequentially, in order, transmit the third optical reference signal so as to generate the multiple optical sideband signals.

Example 50

The microwave-frequency source of Example 49 wherein pairs of sideband optical signals are generated with n ranging from 2 up to at least 100.

Example 51

The microwave-frequency source of Example 49 wherein pairs of sideband optical signals are generated with n ranging from 2 up to at least 1000.

Example 52

The microwave-frequency source of any one of Examples 49 through 51 wherein (i) the intensity modulator comprises an electro-optic Mach-Zehnder modulator, (ii) the dispersion compensator comprises a suitably dispersive optical fiber, (iii) the optical amplifier comprises a doped optical fiber amplifier and (iv) the nonlinear optical medium comprises a nonlinear optical fiber.

Example 53

A method for generating a microwave-frequency output electrical signal at an output frequency $f_M$, using the apparatus of any one of Examples 1 through 52, the method comprising: (a) using the dual optical-frequency reference source, generating (i) the first optical reference signal at the first optical reference frequency $v_1$ and (ii) the second optical reference signal at the second optical reference frequency $v_2 > v_1$; (b) using the electro-optic sideband generator, (i) receiving the third optical reference signal at the third optical reference frequency $v_0$ and the sideband generator input electrical signal at the frequency $f_M$ and (ii) generating therefrom the multiple sideband optical signals at respective sideband optical frequencies of the form $v_0 \pm n f_M$, wherein n is an integer; (c) using one or both of the first optical bandpass filter or the second optical bandpass filter, (i) transmitting through the first optical bandpass filter the first optical reference signal and the subset of the multiple sideband optical signals including the sideband optical signal at the frequency $v_0 - N_1 f_M$, wherein $N_1$ is an integer, or (ii) transmitting through the second optical bandpass filter the second optical reference signal and the subset of the multiple sideband optical signals including the sideband optical signal at the frequency $v_0 + N_2 f_M$, wherein $N_2$ is an integer; (d) using one or both of a first optical detector or a second optical detector, (i) receiving at the first optical detector the optical signals transmitted by the first optical bandpass filter and generating therefrom the first optical detector electrical signal at the first beat frequency $f_{BEAT1} = |v_1 - (v_0 - N_1 f_M)|$, or (ii) receiving at the second optical detector the optical signals transmitted by the second optical bandpass filter and generating therefrom the second optical detector electrical signal at the second beat frequency $f_{BEAT2} = |v_2 - (v_0 + N_2 f_M)|$; (e) using a reference oscillator, generating a reference oscillator electrical signal at a reference oscillator frequency $f_R$; (f) using an electrical circuit, (i) receiving the reference oscillator electrical signal and only one of (A) the first optical detector electrical signal, (B) the second optical detector electrical signal, or (C) the difference electrical signal generated from the first and second optical detector signals by the electrical frequency mixer at the electrical difference frequency $f_{DIFF} = f_{BEAT2} - f_{BEAT1} = |v_2 - v_1 - (N_1 + N_2) \cdot f_M|$, (ii) generating therefrom, using the comparator portion of the electrical circuit, the electrical error signal dependent on the relative phase of the electrical signals received by the electrical circuit, and (iii) processing the electrical error signal using the loop-filter portion of the electrical circuit; and (g) using the voltage-controlled electrical oscillator, (i) receiving the loop-filtered electrical error signal as the VCO input electrical signal and (ii) generating the VCO output electrical signal at the frequency $f_M$, wherein the first portion of the VCO output electrical signal is received by the electro-optic sideband generator as the sideband generator input electrical signal and the second portion of the VCO output electrical signal forms the output electrical signal of the microwave-frequency source, (h) wherein reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

In the appended claims, any labelling of elements, steps, limitations, or other portions of a claim (e.g., (a), (b), (c), etc., or (i), (ii), (iii), etc.) is only for purposes of clarity, and shall not be construed as implying any sort of ordering or precedence of the claim portions so labelled. If any such ordering or precedence is intended, it will be explicitly recited in the claim or, in some instances, it will be implicit or inherent based on the specific content of the claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A microwave-frequency source for generating an output electrical signal at an output frequency $f_M$, the microwave-frequency source comprising:
   (a) a dual optical-frequency reference source arranged so as to generate (i) a first optical reference signal at a first optical reference frequency $v_1$ and (ii) a second optical reference signal at a second optical reference frequency $v_2 > v_1$;
   (b) an electro-optic sideband generator arranged so as to (i) receive a third optical reference signal at a third optical reference frequency $v_0$ and a sideband generator input electrical signal at the frequency $f_M$ and (ii) generate therefrom multiple sideband optical signals at respective sideband optical frequencies of the form $v_0 \pm n f_M$, wherein n is an integer;
   (c) one or both of (i) a first optical bandpass filter arranged so as to transmit the first optical reference signal and a subset of the multiple sideband optical signals including the sideband optical signal at a frequency $v_0 - N_1 f_M$, wherein $N_1$ is an integer, or (ii) a second optical bandpass filter arranged so as to transmit the second optical reference signal and a subset of the multiple sideband optical signals including the sideband optical signal at a frequency $v_0 + N_2 f_M$, wherein $N_2$ is an integer;

(d) one or both of (i) a first optical detector arranged so as to receive the optical signals transmitted by the first optical bandpass filter and to generate therefrom a first optical detector electrical signal at a first beat frequency $f_{BEAT1}=|v_1-(v_0-N_1f_M)|$, or (ii) a second optical detector arranged so as to receive the optical signals transmitted by the second optical bandpass filter and to generate therefrom a second optical detector electrical signal at a second beat frequency $f_{BEAT2}=|v_2-(v_0+N_2f_M)|$;

(e) a reference oscillator arranged so as to generate a reference oscillator electrical signal at a reference oscillator frequency $f_R$;

(f) an electrical circuit arranged so as to (i) receive the reference oscillator electrical signal and only one of (A) the first optical detector electrical signal, (B) the second optical detector electrical signal, or (C) a difference electrical signal generated from the first and second optical detector electrical signals by an electrical frequency mixer at an electrical difference frequency $f_{DIFF}=f_{BEAT2}-f_{BEAT1}=|v_2-v_1-(N_1+N_2)\cdot f_M|$, (ii) generate therefrom, using a comparator portion of the electrical circuit, an electrical error signal dependent on relative phase of the electrical signals received by the electrical circuit, and (iii) process the electrical error signal using a loop-filter portion of the electrical circuit; and (g) a voltage-controlled electrical oscillator arranged so as to (i) receive the loop-filtered electrical error signal as a VCO input electrical signal and (ii) generate a VCO output electrical signal at the frequency $f_M$, wherein a first portion of the VCO output electrical signal is received by the electro-optic sideband generator as the sideband generator input electrical signal and a second portion of the VCO output electrical signal forms the output electrical signal of the microwave-frequency source, (h) wherein reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

2. The microwave-frequency source of claim 1 wherein:
(b') the third optical reference frequency $v_0$ differs from the first optical reference frequency $v_1$ and from the second optical reference frequency $v_2$;
(c') the first optical bandpass filter is arranged so as to transmit the first optical reference signal and a subset of the multiple sideband optical signals including the sideband optical signal at the frequency $v_0-N_1f_M$, and the second optical bandpass filter is arranged so as to transmit the second optical reference signal and a subset of the multiple sideband optical signals including the sideband optical signal at the frequency $v_0+N_2f_M$;
(d') the first optical detector arranged so as to receive the optical signals transmitted by the first optical bandpass filter and to generate therefrom the first optical detector electrical signal at the first beat frequency $f_{BEAT}=|v_1-(v_0-N_1f_M)|$, and the second optical detector arranged so as to receive the optical signals transmitted by the second optical bandpass sideband optical signals and to generate therefrom the second optical detector electrical signal at the second beat frequency $f_{BEAT1}=|v_2-(v_0+N_2f_M)|$; and (f') the electrical circuit is arranged so as to (i) receive the reference oscillator electrical signal and the difference electrical signal at the electrical difference frequency $f_{DIFF}=f_{BEAT2}-f_{BEAT1}=|v_2-v_1-(N_1+N_2)\cdot f_M|$, and (ii) generate therefrom, using the comparator portion of the electrical circuit, the electrical error signal dependent on the relative phase of the reference oscillator electrical signal and the difference electrical signal received by the electrical circuit, and (iii) process the electrical error signal using the loop-filter portion of the electrical circuit.

3. The microwave-frequency source of claim 2 wherein phase noise of the output electrical signal of the microwave-frequency source is reduced by a factor of about $(N_1+N_2)^2$ relative to phase noise of a reference difference frequency signal at a reference optical difference frequency $v_2-v_1$ of the dual optical-frequency reference source.

4. The microwave-frequency source of claim 1 wherein:
(b') the electro-optic sideband generator is arranged so as to (i) receive a portion of the first optical reference signal as the third optical reference signal so that $v_0=v_1$ and (ii) generate therefrom multiple sideband optical signals at respective sideband optical frequencies of the form $v_1\pm nf_M$, wherein n is an integer;
(c') the second optical bandpass filter is arranged so as to transmit the second optical reference signal and a subset of the multiple sideband optical signals including the sideband optical signal at a frequency $v_1+N_2f_M$;
(d') the second optical detector is arranged so as to receive the optical signals transmitted by the second optical bandpass filter and to generate therefrom the second optical detector electrical signal at the second beat frequency $f_{BEAT2}=|v_2-(+N_2f_M)|$; and
(f') the electrical circuit is arranged so as to (i) receive the reference oscillator electrical signal and the second optical detector electrical signal, and (ii) generate therefrom, using the comparator portion of the electrical circuit, the electrical error signal dependent on the relative phase of the reference oscillator electrical signal and the second optical detector electrical signal received by the electrical circuit, and (iii) process the electrical error signal using the loop-filter portion of the electrical circuit.

5. The microwave-frequency source of claim 4 wherein phase noise of the output electrical signal of the microwave-frequency source is reduced by a factor of about $(N_2)^2$ relative to phase noise of a reference difference frequency signal at a reference optical difference frequency $v_2-v_1$ of the dual optical-frequency reference source.

6. The microwave-frequency source of claim 1 wherein:
(b') the electro-optic sideband generator is arranged so as to (i) receive a portion of the second optical reference signal as the third optical reference signal so that $v_0=v_2$ and (ii) generate therefrom multiple sideband optical signals at respective sideband optical frequencies of the form $v_2\pm nf_M$, wherein n is an integer;
(c') the first optical bandpass filter is arranged so as to transmit the first optical reference signal and a subset of the multiple sideband optical signals including the sideband optical signal at a frequency $v_2-N_1f_M$;
(d') the first optical detector is arranged so as to receive the optical signals transmitted by the first optical bandpass filter and to generate therefrom the first optical detector electrical signal at the first beat frequency $f_{BEAT1}=|v_1-(v_2-N_1f_M)|$; and
(f') the electrical circuit is arranged so as to (i) receive the reference oscillator electrical signal and the first optical detector electrical signal, and (ii) generate therefrom, using the comparator portion of the electrical circuit, the electrical error signal dependent on the relative phase of the reference oscillator electrical signal and the first optical detector electrical signal received by the electrical circuit, and (iii) process the electrical error signal using the loop-filter portion of the electrical circuit.

7. The microwave-frequency source of claim 6 wherein phase noise of the output electrical signal of the microwave-frequency source is reduced by a factor of about $(N_1)^2$ relative to phase noise of a reference difference frequency signal at a reference optical difference frequency $v_2-v_1$ of the dual optical-frequency reference source.

8. The microwave-frequency source of claim 1 wherein the output frequency $f_M$ is between about 0.3 GHz and about 300 GHz.

9. The microwave-frequency source of claim 8 wherein the output frequency $f_M$ is between about 1 GHz and about 100 GHz.

10. The microwave-frequency source of claim 1 wherein the reference oscillator frequency is between about 1 MHz and about 1 GHz.

11. The microwave-frequency source of claim 10 wherein the reference oscillator frequency is between about 10 MHz and about 100 MHz.

12. The microwave-frequency source of claim 1 wherein the reference oscillator comprises a crystal oscillator.

13. The microwave-frequency source of claim 1 wherein the reference oscillator comprises an electrical oscillator.

14. The microwave-frequency source of claim 1 wherein a reference optical difference frequency $v_2-v_1$ is greater than about 100 GHz.

15. The microwave-frequency source of claim 14 wherein a reference optical difference frequency $v_2-v_1$ is greater than about 1 THz.

16. The microwave-frequency source of claim 14 wherein a reference optical difference frequency $v_2-v_1$ is greater than about 10 THz.

17. The microwave-frequency source of claim 14 wherein a reference optical difference frequency $v_2-v_1$ is greater than about 100 THz.

18. The microwave-frequency source of claim 1 wherein $N_1+N_2$ is greater than or equal to 10.

19. The microwave-frequency source of claim 18 wherein $N_1+N_2$ is greater than or equal to 50.

20. The microwave-frequency source of claim 18 wherein $N_1+N_2$ is greater than or equal to 100.

21. The microwave-frequency source of claim 18 wherein $N_1+N_2$ is greater than or equal to 1000.

22. The microwave-frequency source of claim 1 wherein the first and second optical reference frequencies $v_1$ and $v_2$ are each between about 75 THz and about 750 THz.

23. The microwave-frequency source of claim 22 wherein the first and second optical reference frequencies $v_1$ and $v_2$ are each between about 120 THz and about 430 THz.

24. The microwave-frequency source of claim 22 wherein the first and second optical reference frequencies $v_1$ and $v_2$ are each between about 150 THz and about 300 THz.

25. The microwave-frequency source of claim 1 wherein the dual optical-frequency reference source is stabilized so as to (i) maintain fluctuations of a reference optical difference frequency $v_2-v_1$ within an operationally acceptable optical reference bandwidth or (ii) maintain phase noise of a reference optical difference frequency signal within an operationally acceptable reference phase noise level.

26. The microwave-frequency source of claim 25 wherein the operationally acceptable reference bandwidth is less than about 100 Hz over about a 1 second timescale.

27. The microwave-frequency source of claim 25 wherein the operationally acceptable reference bandwidth is less than about 1 Hz over about a 1 second timescale.

28. The microwave-frequency source of claim 25 wherein the operationally acceptable reference phase noise level is about −40 dBc/Hz at 100 Hz offset frequency and about −80 dBc/Hz at 10 kHz offset frequency.

29. The microwave-frequency source of claim 25 wherein the operationally acceptable reference phase noise level is about −80 dBc/Hz at 100 Hz offset frequency and about −125 dBc/Hz at 10 kHz offset frequency.

30. The microwave-frequency source of claim 1 wherein (i) the dual optical-frequency reference source comprises first and second pump laser sources and an optical resonator, (ii) a free spectral range of the optical resonator is substantially equal to a Brillouin shift frequency of the optical resonator or an integer submultiple thereof, (iii) each one of the first and second pump laser sources is frequency-locked to a corresponding resonant optical mode of the optical resonator, and (iv) the first and second optical reference signals comprise stimulated Brillouin laser output generated by optical pumping of the optical resonator simultaneously by the first and second pump laser sources, respectively.

31. The microwave-frequency source of claim 30 wherein the third optical reference signal is comprises a portion of the optical output of one of the first or second pump laser sources.

32. The microwave-frequency source of claim 30 wherein the frequency $f_M$ is about equal to the free spectral range of the optical resonator or an integer submultiple thereof.

33. The microwave-frequency source of claim 30 wherein the free spectral range of the optical resonator is substantially equal to the Brillouin shift frequency of the optical resonator.

34. The microwave-frequency source of claim 30 wherein the optical resonator comprises silica and the Brillouin shift frequency of the optical resonator is about 10.9 GHz.

35. The microwave-frequency source of claim 30 wherein the optical resonator comprises a ring optical resonator.

36. The microwave-frequency source of claim 35 wherein the ring optical resonator comprises a disk optical resonator.

37. The microwave-frequency source of claim 30 wherein the optical resonator comprises a fiber optical resonator.

38. The microwave-frequency source of claim 37 wherein the optical resonator comprises a fiber Fabry-Perot optical resonator.

39. The microwave-frequency source of claim 37 wherein the fiber optical resonator comprises a fiber-loop optical resonator.

40. The microwave-frequency source of claim 30 wherein each one of the first and second pump laser sources is frequency-locked to the corresponding resonant optical mode of the optical resonator by a Pound-Drever-Hall mechanism.

41. The microwave-frequency source of claim 1 wherein the dual optical-frequency reference source comprises a dual-mode laser source.

42. The microwave-frequency source of claim 41 wherein the dual optical-frequency reference source comprises first and second reference laser sources, wherein the first and second laser sources are each frequency-locked to a corresponding distinct resonant optical mode of a common optical reference cavity.

43. The microwave-frequency source of claim 42 wherein the third optical reference signal is provided by a third laser source, and the third laser source is frequency-locked to a corresponding resonant optical mode, distinct from the optical modes to which are frequency-locked the first and second laser sources, of the common optical reference cavity.

44. The microwave-frequency source of claim 42 wherein the frequency $f_M$ is about equal to a free spectral range of the common optical reference cavity or an integer submultiple thereof.

45. The microwave-frequency source of claim 1 wherein (i) the electro-optic sideband generator comprises one or more electro-optic phase modulators each driven by a corresponding portion of the sideband generator input electrical signal at the frequency $f_M$, and (ii) the one or more phase modulators are arranged so as to transmit the third optical reference signal so as to generate the multiple optical sideband signals.

46. The microwave-frequency source of claim 45 wherein (i) the electro-optic sideband generator comprises two or more electro-optic phase modulators each driven by a corresponding portion of the sideband generator input electrical signal at the frequency $f_M$, and (ii) the two or more phase modulators are arranged in series so as to sequentially transmit the third optical reference signal so as to generate the multiple optical sideband signals.

47. The microwave-frequency source of claim 46 wherein pairs of sideband optical signals are generated with n ranging from 2 up to at least 30.

48. The microwave-frequency source of claim 46 wherein pairs of sideband optical signals are generated with n ranging from 2 up to at least 100.

49. The microwave-frequency source of claim 46 wherein (i) the electro-optic sideband generator further comprises one or more electro-optic phase modulators each driven by a corresponding portion of the sideband generator input electrical signal at the frequency $f_M$, an intensity modulator driven by a corresponding portion of the sideband generator input electrical signal at the frequency $f_M$, a dispersion compensator, an optical amplifier, and a nonlinear optical medium, and (ii) the one or more phase modulators, the intensity modulator, the dispersion compensator, the optical amplifier, and the nonlinear optical medium are arranged in series so as to sequentially, in order, transmit the third optical reference signal so as to generate the multiple optical sideband signals.

50. The microwave-frequency source of claim 49 wherein pairs of sideband optical signals are generated with n ranging from 2 up to at least 100.

51. The microwave-frequency source of claim 49 wherein pairs of sideband optical signals are generated with n ranging from 2 up to at least 1000.

52. The microwave-frequency source of claim 49 wherein (i) the intensity modulator comprises an electro-optic Mach-Zehnder modulator, (ii) the dispersion compensator comprises a suitably dispersive optical fiber, (iii) the optical amplifier comprises a doped optical fiber amplifier and (iv) the nonlinear optical medium comprises a nonlinear optical fiber.

53. A method for generating a microwave-frequency output electrical signal at an output frequency $f_M$, the method comprising:

(a) using a dual optical-frequency reference source, generating (i) a first optical reference signal at a first optical reference frequency $v_1$ and (ii) a second optical reference signal at a second optical reference frequency $v_2 > v_1$;

(b) using an electro-optic sideband generator, (i) receiving a third optical reference signal at a third optical reference frequency $v_0$ and a sideband generator input electrical signal at the frequency $f_M$ and (ii) generating therefrom multiple sideband optical signals at respective sideband optical frequencies of the form $v_0 \pm n f_M$, wherein n is an integer;

(c) using one or both of a first optical bandpass filter or a second optical bandpass filter, (i) transmitting through the first optical bandpass filter the first optical reference signal and a subset of the multiple sideband optical signals including the sideband optical signal at a frequency $v_0 - N_1 f_M$, wherein $N_1$ is an integer, or (ii) transmitting through the second optical bandpass filter the second optical reference signal and a subset of the multiple sideband optical signals including the sideband optical signal at a frequency $v_0 + N_2 f_M$, wherein $N_2$ is an integer;

(d) using one or both of a first optical detector or a second optical detector, (i) receiving at the first optical detector the optical signals transmitted by the first optical bandpass filter and generating therefrom a first optical detector electrical signal at a first beat frequency $f_{BEAT1} = |v_1 - (v_0 - N_1 f_M)|$, or (ii) receiving at the second optical detector the optical signals transmitted by the second optical bandpass filter and generating therefrom a second optical detector electrical signal at a second beat frequency $f_{BEAT2} = |v_2 - (v_0 + N_2 f_M)|$;

(e) using a reference oscillator, generating a reference oscillator electrical signal at a reference oscillator frequency $f_R$;

(f) using an electrical circuit, (i) receiving the reference oscillator electrical signal and only one of (A) the first optical detector electrical signal, (B) the second optical detector electrical signal, or (C) a difference electrical signal generated from the first and second optical detector signals by an electrical frequency mixer at an electrical difference frequency $f_{DIFF} = f_{BEAT2} - f_{BEAT1} = |v_2 - v_1 - (N_1 + N_2) \cdot f_M|$, (ii) generating therefrom, using a comparator portion of the electrical circuit, an electrical error signal dependent on relative phase of the electrical signals received by the electrical circuit, and (iii) processing the electrical error signal using a loop-filter portion of the electrical circuit; and (g) using a voltage-controlled electrical oscillator, (i) receiving the loop-filtered electrical error signal as a VCO input electrical signal and (ii) generating a VCO output electrical signal at the frequency $f_M$, wherein a first portion of the VCO output electrical signal is received by the electro-optic sideband generator as the sideband generator input electrical signal and a second portion of the VCO output electrical signal forms the output electrical signal of the microwave-frequency source, (h) wherein reception of the first portion of the VCO output electrical signal by the electro-optic sideband generator as the sideband generator input electrical signal results in the electrical circuit and the voltage-controlled oscillator being coupled in a negative feedback arrangement so as to function as a phase-locked loop.

* * * * *